(12) United States Patent
Arisawa et al.

(10) Patent No.: US 11,330,710 B2
(45) Date of Patent: May 10, 2022

(54) METAL-CLAD LAMINATED BOARD, METAL MEMBER PROVIDED WITH RESIN, AND WIRING BOARD

(71) Applicant: PANASONIC INTELLECTUAL PROPERTY MANAGEMENT CO., LTD., Osaka (JP)

(72) Inventors: Tatsuya Arisawa, Fukushima (JP); Hirohisa Goto, Fukushima (JP); Tomoyuki Abe, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 455 days.

(21) Appl. No.: 16/603,067

(22) PCT Filed: Feb. 15, 2018

(86) PCT No.: PCT/JP2018/005256
§ 371 (c)(1),
(2) Date: Oct. 4, 2019

(87) PCT Pub. No.: WO2018/186025
PCT Pub. Date: Oct. 11, 2018

(65) Prior Publication Data
US 2021/0014967 A1 Jan. 14, 2021

(30) Foreign Application Priority Data

Apr. 7, 2017 (JP) .............................. JP2017-076951
Dec. 25, 2017 (JP) .............................. JP2017-247453

(51) Int. Cl.
*H05K 1/03* (2006.01)
*H05K 1/09* (2006.01)
(Continued)

(52) U.S. Cl.
CPC ............ *H05K 1/0353* (2013.01); *B32B 15/14* (2013.01); *C08F 290/06* (2013.01); *H05K 1/0237* (2013.01); *B32B 2307/3065* (2013.01)

(58) Field of Classification Search
CPC .. H05K 1/0313; H05K 1/0353–1/0373; H05K 1/09–1/097; B32B 15/14
See application file for complete search history.

(56) References Cited

U.S. PATENT DOCUMENTS

2010/0129676 A1  5/2010  Fujimoto et al.
2013/0040153 A1  2/2013  Fujimoto et al.
(Continued)

FOREIGN PATENT DOCUMENTS

CN   105492542    4/2016
JP   2002-105308  4/2002
(Continued)

OTHER PUBLICATIONS

ISR issued in International Pat. Appl. No. PCT/JP2018/005256, dated May 15, 2018, English translation.

*Primary Examiner* — Jeremy C Norris
(74) *Attorney, Agent, or Firm* — Greenblum & Bernstein, P.L.C.

(57) ABSTRACT

A metal-clad laminated board includes an insulating layer and a metal layer, in which the insulating layer includes a cured product of a resin composition containing a modified polyphenylene ether compound terminally modified with a substituent having an unsaturated double bond; and a cross-linkable curing agent having an unsaturated double bond in the molecule, and containing 40 to 250 parts by mass of silica particles with respect to 100 parts by mass in total of the modified polyphenylene ether compound and the cross-linkable curing agent, the resin composition contains 0.2 to 5 parts by mass of a first silane coupling agent having an unsaturated double bond in the molecule with respect to 100

(Continued)

parts by mass of the silica particles, and a contact surface of the metal layer in contact with the insulating layer is surface-treated with a second silane coupling agent having an amino group in the molecule.

9 Claims, 3 Drawing Sheets

(51) Int. Cl.
*B32B 15/14* (2006.01)
*C08F 290/06* (2006.01)
*H05K 1/02* (2006.01)

(56) References Cited

U.S. PATENT DOCUMENTS

| | | |
|---|---|---|
| 2014/0044918 A1† | 2/2014 | Zeng |
| 2016/0060429 A1 | 3/2016 | Kitai et al. |
| 2016/0183380 A1† | 6/2016 | Ishii |
| 2016/0234934 A1† | 8/2016 | Higashida |
| 2017/0164469 A1 | 6/2017 | Kitai et al. |
| 2018/0297329 A1 | 10/2018 | Kitai et al. |

FOREIGN PATENT DOCUMENTS

| | | |
|---|---|---|
| JP | 2013-119240 | 6/2013 |
| JP | 2014-201642 | 10/2014 |
| JP | 2015-013474 | 1/2015 |
| JP | 2016-028885 | 3/2016 |
| JP | 2016-28885 A † | 3/2016 |
| TW | 201627391 A | 8/2016 |
| WO | 2008/136373 | 11/2008 |
| WO | 2013/105650 | 7/2013 |
| WO | 2016/009611 | 1/2016 |
| WO | 2017/122249 | 7/2017 |

† cited by third party

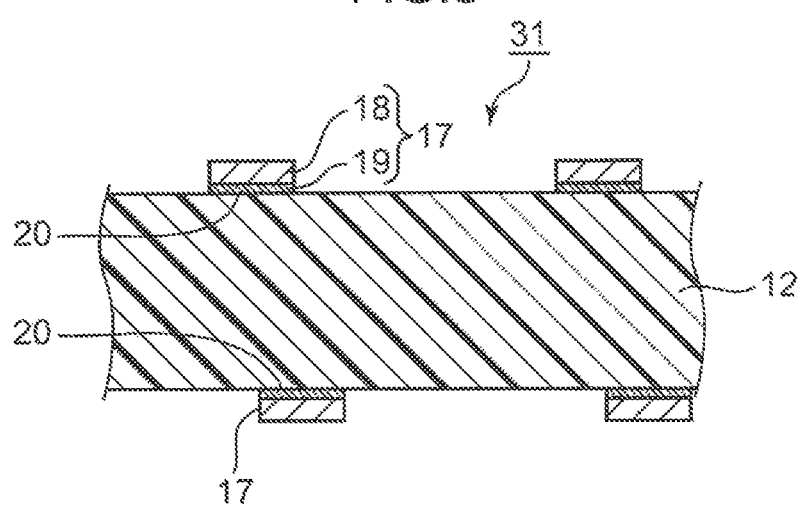

METAL-CLAD LAMINATED BOARD, METAL MEMBER PROVIDED WITH RESIN, AND WIRING BOARD

TECHNICAL FIELD

The present invention relates to a metal-clad laminated board, a metal member with resin, and a wiring board.

BACKGROUND ART

For various electronic devices, with the increase in the amount of information processing, mounting technologies have been rapidly progressed, such as highly integrated semiconductor devices to be mounted, and high-density and multilayer wiring. In addition, there is a demand for wiring boards for use in various electronic devices to be wiring boards for high frequency, such as a millimeter-wave radar board in the case of in-vehicle use, for example.

When signals are transmitted to the wirings provided in the wiring board, transmission losses due to conductors that form the wirings, transmission losses due to the dielectric around the wirings, and the like will be generated. It is known that these transmission losses are particularly likely to be generated in the case of transmitting high-frequency signals to the wirings provided in the wiring boards. From the foregoing, there is a demand for the wiring boards to reduce the losses at the time of signal transmission in order to increase the signal transmission rates. This reduction is required particularly for wiring hoards for high frequency. In order to satisfy this requirement, it is conceivable to use a material which is low in dielectric constant and dielectric loss tangent, as a material for the boards for the purpose of making insulating layers constituting the wiring boards. Examples of such a material for the boards include a resin composition containing polyphenylene ether.

Examples of a metal-clad laminated board obtained with the use of such a resin composition containing polyphenylene ether as a material for the boards include the metal-clad laminated board described in Patent Document 1.

Patent Document 1 describes a metal-clad laminated board including a cured insulating layer containing a polyphenylene ether compound, a metal layer joined to the insulating layer, and an intermediate layer containing a silane compound, the intermediate layer interposed between the insulating layer and the metal layer, in which the metal layer has a joint surface joined to the insulating layer via the intermediate layer, and a ten-point average roughness Rz of the joint surface is 0.5 μm or more and 4 μm or less. According to Patent Document 1, it is disclosed that a metal-clad laminated board is obtained which is capable of manufacturing a printed wiring board with a reduced loss at the time of signal transmission.

CITATION LIST

Patent Literature

Patent Literature 1: Japanese Patent Application Laid-Open No. 2016-28885

SUMMARY OF INVENTION

An object of the present invention is to provide a metal-clad laminated board, a metal member with resin, and a wiring board which are low in dielectric constant and dielectric properties, high in thermal conductivity, and excellent in heat resistance, moisture resistance, and chemical resistance.

One aspect of the present invention is a metal-clad laminated hoard including an insulating layer and a metal layer present in contact with at least one surface of the insulating layer, in which the insulating layer includes a cured product of a resin composition containing a modified polyphenylene ether compound terminally modified with a substituent having a carbon-carbon unsaturated double bond; a crosslinkable curing agent having a carbon-carbon unsaturated double bond in a molecule; a first silane coupling agent having a carbon-carbon unsaturated double bond in a molecule; and at least one of silica particles and silica particles surface-treated with the first silane coupling agent, a total content of the silica particles and the silica particles surface-treated with the first silane coupling agent is 40 to 250 parts by mass with respect to 100 parts by mass in total of the modified polyphenylene ether compound and the crosslinkable curing agent, a total content of the first silane coupling agent contained in the resin composition and the first silane coupling agent contained in the silica particles surface-treated with the first silane coupling agent is 0.2 to 5 parts by mass with respect to 100 parts by mass in total of the silica particles and the silica particles surface-treated with the first silane coupling agent, and a contact surface of the metal layer in contact with the insulating layer is surface-treated with a second silane coupling agent having an amino group in a molecule.

The above-mentioned and other objects, features, and advantages of the present invention will become apparent from the following detailed description.

BRIEF DESCRIPTION OF DRAWINGS

FIG. 3 is a cross-sectional view illustrating a configuration of a wiring board according to another embodiment of the present invention.

DESCRIPTION OF EMBODIMENTS

Figure 1:
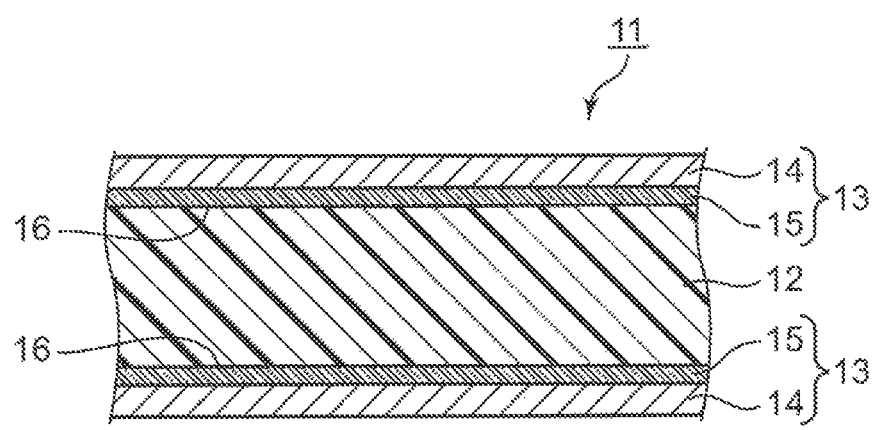
FIG. 1 is a cross-sectional view illustrating a configuration of a metal-clad laminated board according to an embodiment of the present invention.

As described above, there is a demand for wiring boards such as printed wiring boards to reduce the losses at the time of signal transmission in order to increase the signal transmission rates. Therefore, in order to reduce the loss during signal transmission in the wiring boards, there is a demand for the use of, as a material for the boards, a material which is excellent in low-dielectric properties such as lower dielectric constant and dielectric loss tangent.

In wiring hoards with electronic components and the like mounted densely, the amount of heat generation per unit area will be increased. In order to reduce the generation of defects due to the increased amount of heat generation, it is conceivable to enhance the heat dissipation of the wiring boards. In order to satisfy this requirement, it is conceivable to use a material which is high in thermal conductivity as a material for the boards for the purpose of making insulating layers constituting the wiring boards. There is a demand for the wiring boards to not only reduce the loss during signal transmission with the use of, as a material for the boards, a material which is low dielectric constant and dielectric loss tangent, but also use a material which is high in thermal conductivity in order to enhance the heat dissipation of the wiring boards.

Then, the present inventors have focused on the fact that in order to enhance the thermal conductivity, it is conceivable to increase the content of silica particles in the material for the boards for the purpose of making the insulating layers constituting the wiring boards. According to the study of the present inventors, however, it has been found that when an attempt is made to achieve the required thermal conductivity by increasing the content of the silica particles, a defect will be generated due to the excessively high content of the silica particles. Specifically, examples of the defect include, in the metal-clad laminated board, the decreased interlayer adhesive three between the insulating layer and the insulating layer, and the decreased adhesion between the metal layer and the insulating layer. It has been found that as this defect may cause delamination at the time of heating, the heat resistance of the metal-clad laminated board tends to be insufficient.

On the other hand, it is conceivable to use, as the silica particles, silica particles surface-treated with a silane coupling agent, but the cost is increased, thereby making it difficult to meet the price requirement of cost reduction for the final product. Under such circumstances, there is a demand for a metal-clad laminated board which is high in heat resistance so as not to cause delamination or the like at the time of heating, regardless of whether or not the silica particles to be used is surface-treated with a silane coupling agent. In particular, in a case where silica particles surface-treated with no silane coupling agent are used, there has been a tendency to decrease the interlayer adhesive force in the metal-clad laminated board or decreased the adhesive force between the metal layer and the insulating layer as described above. On the other hand, the interlayer adhesive force in the metal-clad laminated board can be enhanced to some extent by so-called integral blending of mixing a silane coupling agent with the resin composition to be used. It has not been easy, however, to prevent the adhesive force between the metal layer and the insulating layer from being decreased.

There is also a demand for wiring boards for use in various electronic devices to be less likely to be affected by changes in the external environment, or the like. For example, as described above, there is a demand for such high heat resistance that can suppress the delamination caused at the time of heating. In addition, there is also a demand for such high moisture resistance that can suppress the occurrence of delamination even in the case of absorbing moisture, such that the wiring boards can be used even in high-humidity environments. In addition, there is also a demand for such high chemical resistance that can suppress the occurrence of delamination in desmear processing, repairing, or the like, in order to cope with the progress of mounting technologies such as highly integrated semiconductor devices and high-density and multilayer wiring.

The present inventors have found, as a result of various studies, that the above-mentioned object of providing a metal-clad laminated board, a metal member with resin, and a wiring board which are low in dielectric constant and dielectric properties, high in thermal conductivity, and excellent in heat resistance, moisture resistance, and chemical resistance is achieved by the following present invention.

Embodiments according to the present invention will be described below, the present invention is not to be considered limited to the embodiments.

[Metal-Clad Laminated Board]

The metal-clad laminated board according to an embodiment of the present invention includes an insulating layer and a metal layer present in contact with at least one surface of the insulating layer. Examples of the metal-clad laminated board 11 include, as shown in FIG. 1, metal-clad laminated boards including an insulating layer 12 and metal layers 13 disposed in contact with both surfaces of the insulating layer 12. Alternatively, the metal-clad laminated board may include a metal layer in contact with only one surface of the insulating layer. FIG. 1 is a cross-sectional view illustrating the configuration of the metal-clad laminated board 11 according to the present embodiment.

The insulating layer 12 includes a cured product of a resin composition containing a modified polyphenylene ether compound terminally modified with a substituent having a carbon-carbon unsaturated double bond, and a crosslinkable curing agent baying a carbon-carbon unsaturated double bond in the molecule. The resin composition contains not only the modified polyphenylene ether compound and the crosslinkable curing agent, but also a first silane coupling agent having a carbon-carbon unsaturated double bond in the molecule, and at least one of silica particles and silica particles surface-treated with the first silane coupling agent. More specifically, the resin composition may contains not only silica particles subjected to no surface treatment, but also silica particles surface-treated with the first silane coupling agent, and may contain the first silane coupling agent separately from the first silane coupling agent contained in the silica particles surface-treated with the first silane coupling agent. Further, the total content of the silica particles and the silica particles surface-treated with the first silane coupling agent is 40 to 250 parts by mass with respect to 100 parts by mass in total of the modified polyphenylene ether compound and the crosslinkable curing agent. In addition, the content of the first silane coupling agent is 0.2 to 5 parts by mass with respect to 100 parts by mass in total of the silica particles and the silica particles surface-treated with the first silane coupling agent.

Such a metal-clad laminated board is a metal-clad laminated board which is low in dielectric constant and dielectric properties, high in thermal conductivity, and excellent in heat resistance, moisture resistance, and chemical resistance. This is believed to be because of the fallowing.

The cured product included in the insulating layer is obtained by curing the modified polyphenylene ether in the resin composition with the crosslinkable curing agent, and thus believed to be capable of exhibiting the excellent low dielectric properties of polyphenylene ether. Furthermore, the resin composition contains therein at least one of the silica particles and the silica particles surface-treated with the first silane coupling agent in a relatively large amount as described above, and the cured product of the resin composition is thus believed to be capable of enhancing the thermal conductivity. Further, the resin composition contains, in the predetermined amount, the first silane coupling agent having a carbon-carbon unsaturated double bond in the molecule. Furthermore, a metal layer surface-treated with a second silane coupling agent having an amino group in the molecule is used as the metal layer in contact with the insulating layer including the cured product of the resin composition. It is believed that even in a case where the insulating layer is composed of multiple layers, the adhesive force between the respective layers, that is, the interlayer adhesive force is increased by the first silane coupling agent contained in the resin composition which is a raw material for the cured product constituting the insulating layer. Furthermore, the adhesive force between the metal layer and the insulating layer is believed to be also increased by the first silane coupling agent contained in the resin composition which is a raw material for the cured product constituting the insulating layer and the second silane coupling agent for use in the surface treatment for the metal layer. From the foregoing, it is believed that even when the obtained metal-clad laminated board is heated, a metal-clad laminated board which is high in heat resistance is provided such that the occurrence of delamination is suppressed. Furthermore, it is believed that even when the obtained metal-clad laminated board is subjected to a moisture absorption treatment, or even when the obtained metal-clad laminated board is treated with a chemical such as acid, a metal-clad laminated board which is high in both moisture resistance and chemical resistance is provided such that the occurrence of delamination is suppressed. Thus, the obtained metal-clad laminated board is low in dielectric constant and dielectric properties, high in thermal conductivity, and excellent in heat resistance, moisture resistance and chemical resistance.

The insulating layer 12 is not particularly limited as long as the insulating layer 12 includes the cured product of the resin composition. The insulating layer 12 may be, for example, a layer composed of only the cured product of the resin composition, or a layer including not only the cured product of the resin composition but also a fibrous base material. The insulating layer 12 including the fibrous base material can improve strength, heat resistance, and the like. Examples of the insulating layer including the fibrous base material include, specifically, a layer obtained by impregnating the fibrous base material with the resin composition and curing the resin composition with which the fibrous base material is impregnated, and the like.

(Modified Polyphenylene Ether Compound)

The modified polyphenylene ether compound for use in the present embodiment is not particularly limited as long as the compound is polyphenylene ether terminally modified by a substituent having a carbon-carbon unsaturated double bond.

The substituent having a carbon-carbon unsaturated double bond is not particularly limited. Examples of the substituent include a substituent represented by following formula (1), and the like.

[Chemical Formula 1]

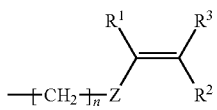

(1)

In the formula (1), n represents 0 to 10. Z represents an arylene group. $R^1$ to $R^3$ are each independent of one another. More specifically, $R^1$ to $R^3$ may be identical to or different from one another. $R^1$ to $R^3$ each represent a hydrogen atom or an alkyl group.

it is to be noted that the formula (1) represents, in a case where n is 0, a substituent with Z directly bonded to a terminal of the polyphenylene ether.

The arylene group is not particularly limited. Examples of the arylene group include, specifically, a monocyclic aromatic group such as a phenylene group, and a polycyclic aromatic group in which the aromatic ring is not a single ring but is a polycyclic aromatic ring such as a naphthalene ring, and the like. Examples of the arylene group also include derivatives in which a hydrogen atom bonded to the aromatic ring is substituted with a functional group such as an alkenyl group, an alkynyl group, a formyl group, an alkylcarbonyl group, an alkenylcarbonyl group, or an alkynylcarbonyl group. The alkyl group is not particularly limited, and for example, an alkyl group having 1 to 18 carbon atoms is preferred, and an alkyl group having 1 to 10 carbon atoms is more preferred. Specifically, examples of the alkyl group include a methyl group, an ethyl group, a propyl group, a hexyl group, a decyl group, and the like.

In addition, more specifically, examples of the substituent include vinylbenzyl groups (ethenylbenzyl groups) such as a p-ethenylbenzyl group and a m-ethenylbenzyl group, vinylphenyl groups, acrylate groups, methacrylate groups, and the like.

Preferred specific example of the substituent represented by the above-mentioned formula (1) include functional groups including a vinylbenzyl group. Specifically, examples of the functional group include at least one substituent selected from the following formula (2) or formula (3), and the like.

[Chemical Formula 2]

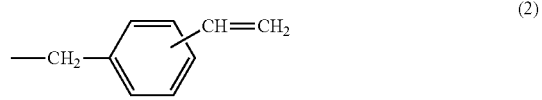

(2)

[Chemical Formula 3]

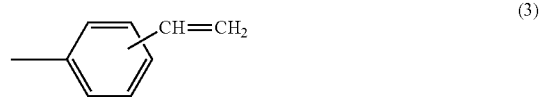

(3)

Examples of the other substituent having a carbon-carbon unsaturated double bond, by which the modified polyphenylene ether tsar use in the present embodiment is terminally modified, include (meth)acrylate groups, and they are represented by, for example, the following formula (4).

[Chemical Formula 4]

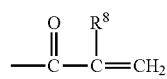

(4)

In the formula (4), $R^8$ represents a hydrogen atom or an alkyl group. The alkyl group is not particularly limited, and for example, an alkyl group having 1 to 18 carbon atoms is preferred, and an alkyl group having 1 to 10 carbon atoms is more preferred. Specifically, examples of the alkyl group include a methyl group, an ethyl group, a propyl group, a hexyl group, a decyl group, and the like.

The modified polyphenylene ether has a polyphenylene ether chain in the molecule, and preferably has, for example, a repeating unit represented by the following formula (5) in the molecule.

[Chemical Formula 5]

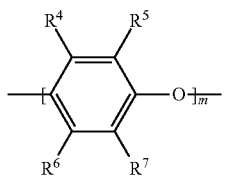

(5)

In the formula (5), m represents 1 to 50. $R^4$ to $R^7$ are each independent of one another. More specifically, $R^4$ to $R^7$ may be identical to or different from one another. In addition, $R^4$ to $R^7$ each represent a hydrogen atom, an alkyl group, an alkenyl group, an alkynyl group, a formyl group, an alkylcarbonyl group, an alkenylcarbonyl group, or an alkynylcarbonyl group. Among these groups, a hydrogen atom and an alkyl group are preferred.

Examples of the respective functional groups listed as $R^4$ to $R^7$ specifically include the following.

The alkyl group is not particularly limited, but for example, an alkyl group having 1 to 18 carbon atoms is preferred, and an alkyl group having 1 to 10 carbon atoms is more preferred. Specifically, examples of the alkyl group include a methyl group, an ethyl group, a propyl group, a hexyl group, a decyl group, and the like.

Further, the alkenyl group is not particularly limited, but for example, an alkenyl group having 2 to 18 carbon atoms is preferred, and an alkenyl group having 2 to 10 carbon atoms is more preferred. Specifically, examples thereof include a vinyl group, an allyl group, a 3-butenyl group, and the like.

Further, the alkynyl group is not particularly limited, but for example, an alkynyl group having 2 to 18 carbon atoms is preferred, and an alkynyl group having 2 to 10 carbon atoms is more preferred. Specifically, examples thereof include an ethynyl group, a prop-2-yn-1-yl group (propargyl group), and the like.

The alkylcarbonyl group is not particularly limited as long as the group is a carbonyl group substituted with an alkyl group, but for example, an alkylcarbonyl group having 2 to 18 carbon atoms is preferred, and an alkylcarbonyl group having 2 to 10 carbon atoms is more preferred. Specifically, examples thereof include an acetyl group, a propionyl group, a butyryl group, an isobutyryl group, a pivaloyl group, a hexanoyl group, an octanoyl group, a cyclohexylcarbonyl group, and the like.

The alkenylcarbonyl group is not particularly limited as long as the group is a carbonyl group substituted with an alkenyl group, but for example, an alkenylcarbonyl group having 3 to 18 carbon atoms is preferred, and an alkenylcarbonyl group having 3 to 10 carbon atoms is more preferred. Specifically, examples thereof include an acryloyl group, a methacryloyl group, a crotonoyl group, and the like.

The alkynylcarbonyl group is not particularly limited as long as the group is a carbonyl group substituted with an alkynyl group, but for example, an alkynylcarbonyl group having 3 to 18 carbon atoms is preferred, and an alkynylcarbonyl group having 3 to 10 carbon atoms is more preferred. Specifically, examples thereof include a propioloyl group and the like.

The weight average molecular weight (Mw) of the modified polyphenylene ether compound for use in the present embodiment is not particularly limited. Specifically, the weight average molecular weight is preferably 500 to 5000, more preferably 800 to 4000, and further preferably 1000 to 3000. It is to be noted that in this regard, the weight average molecular weight may have any value measured by a common molecular weight measurement method, and specifically, examples thereof include a value measured with the use of gel permeation chromatography (GPC), and the like. In a case where the modified polyphenylene ether compound has a repeating unit represented by the formula (5) in the molecule, m is preferably a numerical value such that the weight average molecular weight of the modified polyphenylene ether compound falls within the foregoing range. Specifically, m is preferably 1 to 50.

When the weight-average molecular weight of the modified polyphenylene: ether compound falls within the foregoing range, the polyphenylene ether has excellent low dielectric properties, and the cured product is not only more excellent in heat resistance, but also excellent in moldability. This is believed to be because of the following. As for a typical polyphenylene ether, when the weight average molecular weight thereof falls within the foregoing range, the heat resistance of the cured product tends to be decreased, because the polyphenylene ether has a relatively low molecular weight. In this respect, it is believed that because the modified polyphenylene ether compound has an unsaturated double bond at a terminal, the cured product thereof can be obtained which has sufficiently high heat resistance. Further, when the weight average molecular weight of the modified polyphenylene ether compound falls within the foregoing range, the cured product thereof is believed to be also excellent in moldability, because the polyphenylene ether has a relatively low molecular weight. Thus, such a modified polyphenylene ether compound is believed to be obtained, such that the cured product thereof is not only more excellent in heat resistance, but also excellent in moldability.

Furthermore, the average number of substituents at a molecular terminal (the number of terminal functional groups) per molecule of the modified polyphenylene ether is not specifically limited, in the modified polyphenylene ether compound for use in the present embodiment. Specifically, the number is preferably 1 to 5, more preferably 1 to 3, and further preferably 1.5 to 3. If the number of terminal functional groups is excessively small, the heat resistance of the cured product tend to be less likely to be sufficiently obtained. Alternatively, if the number of terminal functional groups is excessively large, the reactivity will be excessively increased, there is a possibility that problems may be caused, such as the decreased storage stability of the resin composition or the decreased fluidity of the resin composition. More specifically, there is a possibility that the use of such a modified polyphenylene ether may cause, due to insufficient fluidity, for example, defective molding such as the generation of a void during multi-layer molding, and cause the molding problem of being less likely to obtain a highly reliable wiring board.

It is to be noted that examples of the number of terminal functional groups of the modified polyphenylene ether compound include a numerical value that represents the average value for the substituent per molecule of all modified polyphenylene ether compounds present in 1 mole of the modified polyphenylene ether compound, and the like. The number of terminal functional groups can be measured, for example, by measuring the number of hydroxyl groups remaining in the obtained modified polyphenylene ether compound and calculating the decrease from the number of hydroxyl groups of the polyphenylene ether before the modification. The decrease from the number of hydroxyl groups of the polyphenylene ether before the modification refers to the number of terminal functional groups. Further, as a method for measuring the number of hydroxyl groups remaining in the modified polyphenylene ether compound, the number can be determined by adding a quaternary ammonium salt (tetraethyl ammonium hydroxide) that associates with the hydroxyl groups, to a solution of the modified polyphenylene ether compound, and measuring the UV absorbance of the mixed solution.

Further, the intrinsic viscosity of the modified polyphenylene ether compound for use in the present embodiment is not particularly limited. Specifically, the intrinsic viscosity is preferably 0.03 to 0.12 dl/g, more preferably 0.04 to 0.11 dl/g, and further preferably 0.06 to 0.095 dl/g. If the intrinsic viscosity is excessively low, the molecular weight tends to be low, and low dielectric properties such as a low dielectric constant and a low dielectric loss tangent tend to be less likely to be obtained. On the other hand, if the intrinsic viscosity is excessively high, the viscosity is high, insufficient fluidity cannot be obtained, and the moldability of the cured product tends to be decreased. Thus, if the intrinsic viscosity of the modified polyphenylene ether compound falls within the range mentioned above, excellent heat resistance and moldability of the cured product can be achieved.

It is to be noted that the intrinsic viscosity herein refers to an intrinsic viscosity measured in methylene chloride at 25° C., and more specifically, for example, a value obtained by measuring the viscosity of a 0.18 g/45 ml methylene chloride solution (liquid temperature: 25° C.) with a viscometer. Examples of this viscometer include AVS 500 Visco System manufactured by Schott.

In addition, the method for synthesizing the modified polyphenylene ether compound for use in the present embodiment is not particularly limited as long as the method is capable of synthesizing a modified polyphenylene ether compound terminally modified with a substituent having a carbon-carbon unsaturated double bond. Specifically, examples of the method include a method of reacting a compound in which a substituent having a carbon-carbon unsaturated double bond and a halogen atom are bonded, with polyphenylene ether, and the like.

Examples of the compound in which a substituent having a carbon-carbon unsaturated double bond and a halogen atom are bonded include a compound represented by the formula (6), and the like.

[Chemical Formula 6]

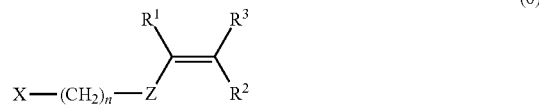

(6)

In the formula (6), n, Z, and $R^1$ to $R^3$ represent the same as n, Z, and $R^1$ to $R^3$ in the formula (1). Specifically, n represents 0 to 10. Z represents an arylene group. $R^1$ to $R^3$ are each independent of one another. More specifically, $R^1$ to $R^3$ may be identical to or different from one another. In addition, $R^1$ to $R^3$ each represent a hydrogen atom or an alkyl group. Further, X represents a halogen atom, and specifically, examples thereof include a chlorine atom, a bromine atom, an iodine atom, a fluorine atom, and the like. Among these atoms, a chlorine atom is preferred.

For the compound represented by the formula (6), the examples mentioned above may be used alone, or two or more thereof may be used in combination.

Further, examples of the compound in which a substituent having a carbon-carbon unsaturated double bond and a halogen atom are bonded include p-chloromethylstyrene, m-chloromethylstyrene, and the like.

The polyphenylene ether which is a raw material is not particularly limited as long as a predetermined modified polyphenylene ether compound can be finally synthesized with the polyphenylene ether. Specifically, examples thereof include compounds containing polyphenylene ether as a main constituent, such as polyphenylene ether composed of 2,6-dimethylphenol and at least one of bifunctional phenol and trifunctional phenol and poly(2,6-dimethyl-1,4-phenylene oxide), and the like. The bifunctional phenol is a phenol compound having two phenolic hydroxyl groups in the molecule, and examples thereof include tetramethyl bisphenol A, and the like. The trifunctional phenol is a phenol compound having three phenolic hydroxyl groups in the molecule. More specifically, examples of such polyphenylene ether include a polyphenylene ether that has a structure as indicated in the formula (7) or the formula (8), and the like.

[Chemical Formula 7]

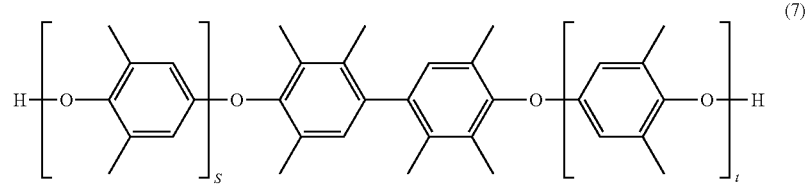

(7)

In the formula (7), as for s and t, for example, the total value of s and t is preferably 1 to 30. In addition, s is preferably 0 to 20, and t is preferably 0 to 20. More specifically, preferably s represents 0 to 20, t represents 0 to 20, and the sum of s and t represents 1 to 30.

[Chemical Formula 8]

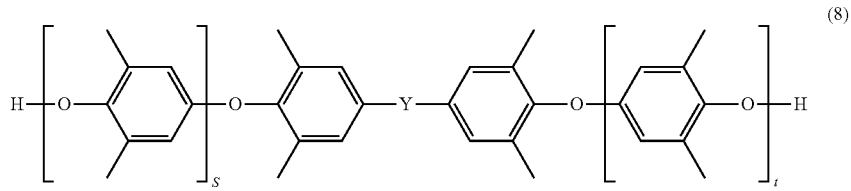

(8)

In the formula (8), as for s and t, for example, the total value of s and t is preferably 1 to 30. In addition, s is preferably 0 to 20, and t is preferably 0 to 20. More specifically, preferably s represents 0 to 20, t represents 0 to 20, and the sum of s and t represents 1 to 30. Y represents a linear, branched, or cyclic hydrocarbon group. In addition, Y represents, for example, a group represented by the following formula (9).

[Chemical Formula 9]

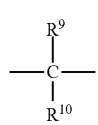

(9)

In the formula (9), $R^9$ and $R^{10}$ each independently represent a hydrogen atom or an alkyl group. Examples of the alkyl group include a methyl group, and the like. Furthermore, examples of the group represented by the formula (9) include a methylene group, a methyl methylene group, a dimethyl methylene group, and the like.

Preferred as the modified polyphenylene ether compound is the polyphenylene ether that has a structure as indicated in the formula (7) or the formula (8), which is terminally modified with a substituent having a carbon-carbon unsaturated double bond as described above.

Examples of the modified polyphenylene ether compound include the polyphenylene ether represented by the formula (7) or the formula (8) having, at a terminal thereof, a group represented by the formula (1) or the formula (4), and more specifically, include modified polyphenylene ether represented by the following formula (10) to the following formula (12).

[Chemical Formula 10]

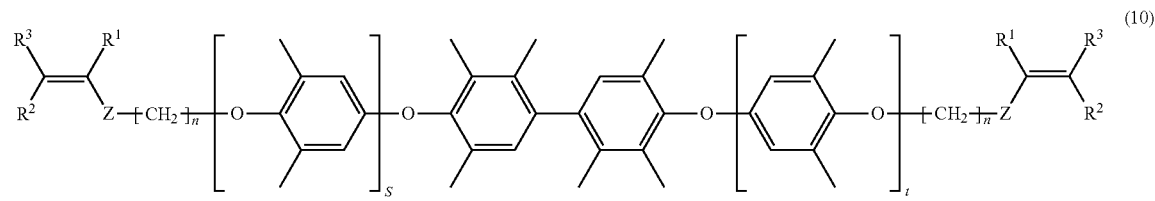

(10)

In the formula (10), s and t are the same as s and t of the formula (7). Furthermore, in the formula (10), $R^1$ to $R^3$ are the same as $R^1$ to $R^3$ in the formula (1) mentioned above, Z is the same as Z in the formula (1), and n is the same as n in the formula (1).

[Chemical Formula 11]

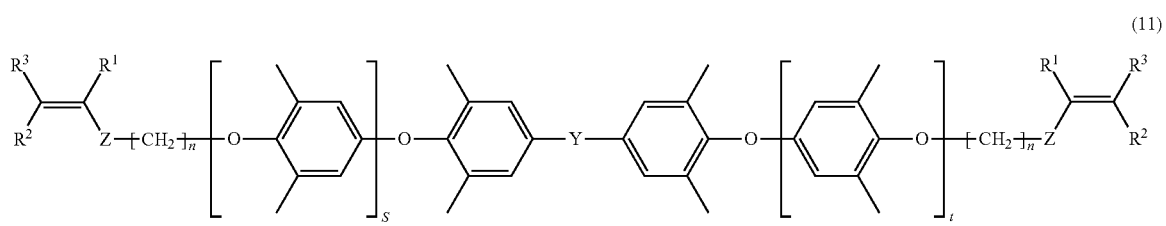

(11)

In the formula (11), s and t are the same as s and t in the formula (8), and Y is the same as Y in the formula (8). Furthermore, in the formula (11), $R^1$ to $R^3$ are the same as $R^1$ to $R^3$ in the formula (1) mentioned above, Z is the same as Z in the formula (1), and n is the same as n in the formula (1).

[Chemical Formula 12]

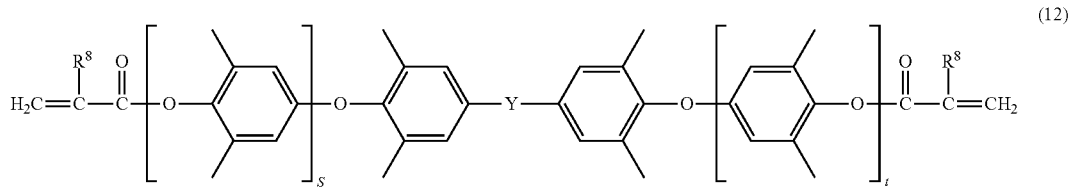

In the formula (12), s and t are the same as s and t in the formula (8), and Y is the same as Y in the formula (8). Furthermore, in the formula (12), $R^8$ is the same as $R^8$ in the formula (4) mentioned above.

Moreover, examples of the method for synthesizing the modified polyphenylene ether compound include the method described above. Specifically, the polyphenylene ether as mentioned above and the compound represented by the formula (6) are dissolved in a solvent and stirred. Then, the polyphenylene ether and the compound represented by the formula (6) react, thereby providing the modified polyphenylene ether compound for use in the present embodiment.

In addition, this reaction is preferably performed in the presence of an alkali metal hydroxide. Thus, this reaction is believed to proceed in a preferred manner. This is believed to be because the alkali metal hydroxide functions as a dehalogenation agent, specifically, a dehydrochlorination agent. More specifically, the alkali metal hydroxide is believed to eliminate hydrogen halide from the phenol group of the polyphenylene ether and the compound represented by the formula (6), thereby, instead of the hydrogen atom of the phenol group of polyphenylene ether, bonding the substituent represented by the formula (1) to the oxygen atom of the phenol group.

In addition, the alkali metal hydroxide is not particularly limited as long as the alkali metal hydroxide can act as a dehalogenation agent, and examples thereof include sodium hydroxide and the like. In addition, the alkali metal hydroxide is typically used in the form of an aqueous solution, and specifically, used as an aqueous solution of sodium hydroxide.

Furthermore, the reaction conditions, such as reaction time and reaction temperature, also vary depending on the compound represented by the formula (6), and the like, and the conditions are not particularly limited as long as the conditions cause such a reaction as mentioned above to proceed in a preferred manner. Specifically, the reaction temperature is preferably room temperature to 100° C., and more preferably 30 to 100° C. In addition, the reaction time is preferably 0.5 to 20 hours, and more preferably 0.5 to 10 hours.

Furthermore, the solvent used for the reaction is not particularly limited as long as the solvent is capable of dissolving the polyphenylene ether and the compound represented by the formula (6), and will not interfere with the reaction between the polyphenylene ether and the compound represented by the formula (6). Specifically, examples of the solvent include toluene and the like.

In addition, the above-mentioned reaction is preferably performed in the presence of not only an alkali metal hydroxide but also a phase transfer catalyst. More specifically, the above-mentioned reaction is preferably performed in the presence of an alkali metal hydroxide and a phase transfer catalyst. Thus, this reaction is believed to proceed in a more preferred manner. This is believed to be because of the following. The phase transfer catalyst has the function of taking in the alkali metal hydroxide, and serves as a catalyst that is soluble in both the phase of a polar solvent such as water and the phase of a nonpolar solvent such as an organic solvent, and capable of transferring between the phases. Specifically, in a case where an aqueous solution of sodium hydroxide is used as the alkali metal hydroxide, whereas an organic solvent such as toluene, which is not compatible with water, is used as the solvent, it is believed that even when the aqueous solution of sodium hydroxide is delivered by drops into the solvent subjected to the reaction, the solvent and the aqueous solution of sodium hydroxide are separated, thereby making the sodium hydroxide less likely to transfer to the solvent. In such a case, the aqueous solution of sodium hydroxide added as an alkali metal hydroxide is believed to become less likely to contribute to the reaction promotion. On the other hand, the reaction in the presence of an alkali metal hydroxide and a phase transfer catalyst is believed to cause the alkali metal hydroxide taken in the phase transfer catalyst to transfer to a solvent, thereby making the aqueous solution of sodium hydroxide more likely to contribute to the reaction promotion. For this reason, the reaction in the presence of an alkali metal hydroxide and a phase transfer catalyst is believed to cause the reaction to proceed in a more preferred manner.

In addition, the phase transfer catalyst is not particularly limited, and examples thereof include quaternary ammonium salts such as tetra-n-butylammonium bromide, and the like.

The resin composition for use in the present embodiment preferably contains, as the modified polyphenylene ether compound, the modified polyphenylene ether compound obtained in the way mentioned above.

(Crosslinkable Curing Agent)

The crosslinkable curing agent for use in the present embodiment is not particularly limited as long as the agent has a carbon-carbon unsaturated double bond in the molecule. More specifically, the crosslinkable curing agent may be any agent that can be reacted with the modified polyphenylene ether compound to form a crosslink for curing. The crosslinkable curing agent is preferably a compound having two or more carbon-carbon unsaturated double bonds in the molecule.

In addition, the crosslinkable curing agent for use in the present embodiment preferably has a weight average molecular weight of 100 to 5000, more preferably 100 to 4,000, and further preferably 100 to 3000. If the weight average molecular weight of the crosslinkable curing agent is excessively low, there is a possibility that the crosslinkable curing agent may be easily volatilized from the blended component system of the resin composition. Alternatively, if the weight average molecular weight of the crosslinkable curing agent is excessively high, there is a possibility of excessively increasing the viscosity of the varnish of the resin composition and the melt viscosity during heat molding. Thus, when the weight average molecular weight of the crosslinkable curing agent fails within the foregoing range, a resin composition is obtained which is more excellent in the heat resistance of the cured product. This is believed to be because crosslinking can be formed in a preferred fashion by reaction with the modified polyphenylene ether compound. It is to be noted that in this regard, the weight average molecular weight may have any value measured by a common molecular weight measurement method, and specifically, examples thereof include a value measured with the use of gel permeation chromatography (GPC), and the like.

Furthermore, as for the crosslinkable curing agent for use in the present embodiment, the average number of carbon-carbon unsaturated double bonds (the number of terminal double bonds) per molecule of the crosslinkable curing agent varies depending on the weight average molecular weight of the crosslinkable curing agent, but the average number is preferably, for example, 1 to 20, and more preferably 2 to 18. If the number of terminal double bonds is excessively small, there is a tendency to make the heat resistance of the cured product less likely to be obtained sufficiently. Alternatively, if the number of terminal double bonds is excessively large, the reactivity is excessively increased, and for example, there is a possibility of decreasing the storage stability of the resin composition or decreasing the fluidity of the resin composition.

In addition, in consideration of the weight average molecular weight of the crosslinkable curing agent, the number of terminal double bonds of the crosslinkable curing agent is preferably 1 to 4, in a case where the weight average molecular weight of the crosslinkable curing agent is less than 500 (for example, 100 or more and less than 500). In addition, the number of terminal double bonds of the crosslinkable curing agent is preferably 3 to 20, in a case where the weight average molecular weight of the crosslinkable curing agent is 500 or more (for example, 500 or more and 5000 or less). In each case, if the number of terminal double bonds is smaller than the lower limit value of the above-mentioned range, the reactivity of the crosslinkable curing agent is decreased, thereby decreasing the crosslink density of the cured product of the resin composition, and there is a possibility of making it impossible to sufficiently improve the heat resistance and Tg. On the other hand, if the number of terminal double bonds is larger than the upper limit value of the range mentioned above, there is a possibility of making the resin composition more likely to be gelled.

It is to be noted that the number of terminal double bonds herein is known from the specification value of the product of the crosslinkable curing agent used. Examples of the number of terminal double bonds herein include, specifically, a numerical value that represents the average value for the number of double bonds per molecule of all crosslinkable curing agents in 1 mol of the crosslinkable curing agent, and the like.

Furthermore, examples of the crosslinkable curing agent for use in the present embodiment specifically include trialkenyl isocyanurate compounds such as triallyl isocyanurate (TAIC), polyfunctional methacrylate compound having two or more methacryl groups in the molecule, a polyfunctional acrylate compound having two or more acrylic groups in the molecule, a vinyl compound having two or more vinyl groups in the molecule (polyfunctional vinyl compound) such as polybutadiene, and vinyl benzyl compounds such as styrene having a vinyl benzyl group in the molecule and divinylbenzene. Among these examples, the compounds are preferred which have two or more carbon-carbon double bonds in the molecule. Specifically, examples thereof include trialkenyl isocyanurate compounds, polyfunctional acrylate compounds, polyfunctional methacrylate compounds, polyfunctional vinyl compounds, divinylbenzene compounds, and the like. With the use of the foregoing compounds, crosslinking is believed to be formed by a curing reaction in a more preferred manner, and the heat resistance of the cured product of the resin composition for use in the present embodiment can be further enhanced. In addition, as the crosslinkable curing agent, the exemplified crosslinkable curing agents may be used alone, or two or more thereof may be used in combination. In addition, a compound having two or more carbon-carbon unsaturated double bonds in the molecule and a compound having one carbon-carbon unsaturated double bond in the molecule may be used in combination as the crosslinkable curing agent. Examples of the compound having one carbon-carbon unsaturated double bond in the molecule, specifically, include a compound having a vinyl group in the molecule (monovinyl compound).

(Content)

The content of the modified polyphenylene ether compound is preferably 30 to 90 parts by mass, and more preferably 50 to 90 parts by mass with respect to 100 parts by mass in total of the modified polyphenylene ether compound and the crosslinkable curing agent. The content of the crosslinkable curing agent is preferably 10 to 70 parts by mass, and more preferably 10 to 50 parts by mass with respect to 100 parts by mass in total of the modified polyphenylene ether compound and the crosslinkable curing agent. More specifically, the content ratio between the modified polyphenylene ether compound and the crosslinkable curing agent is preferably 90:10 to 30:70 by mass ratio, and more preferably 90:10 to 50:50. As long as the respective contents of the modified polyphenylene ether compound and the crosslinkable curing agent satisfy the ratio mentioned above, a resin composition is provided which is excellent in the heat resistance and flame retardance of the cured material. This is believed to be because the curing reaction between the modified polyphenylene ether compound and the crosslinkable curing agent proceeds in a preferred manner.

As described above, the resin composition contains the first silane coupling agent and the silica particles in addition to the modified polyphenylene ether and the crosslinkable curing agent.

(First Silane Coupling Agent)

The first silane coupling agent for use in the present embodiment is not particularly limited as long as the silane coupling agent has a carbon-carbon unsaturated double bond in the molecule. Examples of the silane coupling agent include, specifically, silane coupling agents having at least one functional group selected from the group consisting of a methacryloxy group, a styryl group, a vinyl group, an acryloxy group, and the like. More specifically, examples of the silane coupling agent include a compound having at least one of a methacryloxy group, a styryl group, a vinyl group, and an acryloxy group as a reactive functional group, and further having a hydrolyzable group such as a methoxy group or an ethoxy group, and the like. Examples of the first silane coupling agent having a methacryloxy group include 3-methacryloxypropyltrimethoxysilane, 3-methacryloxypropylmethyldimethoxysilane, 3-methacryloxypropyltriethoxysilane, methacryloxypropylmethyldiethoxysilane, 3-methacryloxypropylethyldiethoxysilane, and the like. Examples of the first silane coupling agent having a styryl group include p-styryltrimethoxysilane, p-styryitriethoxysilane, and the like. Examples of the first silane coupling agent having a vinyl group include vinyltriethoxysilane, vinyltrimethoxysilane, and the like. In addition, examples of the first silane coupling agent having an acryloxy group include 3-acryloxypropyltrimethoxysilane, 3-acryloxypropyltriethoxysilane, and the like.

Further, examples of the first silane coupling agent include a first silane coupling agent contained in the resin composition, and a first silane coupling agent contained in silica particles surface-treated with the first silane coupling agent. The first silane coupling agent contained in the resin composition and the first silane coupling agent contained in the silica particles surface-treated with the first silane coupling agent may be each any silane coupling agent having a carbon-carbon unsaturated double bond in the molecule, and the first silane coupling agents may be the same silane coupling agent or different silane coupling agents.

(Silica Particles and Silica Particles Surface-Treated with First Silane Coupling Agent)

The silica particles for use in the present embodiment are not particularly limited, and may be surface-treated silica particles or non-surface-treated silica particles. Further, examples of the silica particles include so-called spherical silica. In addition, examples of the surface treatment include a treatment with a silane coupling agent, and the like. In addition, the surface-treated silica particles may be silica particles obtained by surface-treating silica particles with the first silane coupling agent. More specifically, the resin composition includes any one of the silica particles and the silica particles surface-treated with the first silane coupling agent.

Furthermore, the total content of the silica particles and the silica particles surface-treated with the first silane coupling agent is 40 to 250 parts by mass, preferably 100 to 250 parts by mass, more preferably 120 to 230 parts by mass, and further preferably 150 to 200 parts by mass with respect to 100 parts by mass in total of the modified polyphenylene ether and the crosslinkable curing agent. It is to be noted that the total content herein refers to the content of the silica particles surface-treated with the first silane coupling agent in the case of containing the silica particles surface-treated with the first silane coupling agent without containing the silica particles, or refers to the content of the silica particles in the case of containing the silica particles without containing the silica particles surface-treated with the first silane coupling agent. If the total content is excessively low, the thermal conductivity of the metal-clad laminated board tends to be insufficiently increased. Alternatively, if the total content is excessively high, excellent low dielectric properties are less likely to be obtained, and the heat resistance tends to be decreased. Thus, the total content within the range mentioned above can increase the thermal conductivity while maintaining excellent low dielectric properties, heat resistance, moisture resistance, and chemical resistance.

Furthermore, the content of the first silane coupling agent is 0.2 to 5 parts by mass, preferably 0.5 to 5 parts by mass, more preferably 0.7 to 4.5 parts by mass, and further preferably 1 to 3 parts by mass with respect to 100 parts by mass in total of the silica particles and the silica particles surface-treated with the first silane coupling agent. The content of the first silane coupling agent herein refers to the total of the content of the first silane coupling agent contained in the resin composition; and the content of the first silane coupling agent content contained in the silica particles surface-treated with the first silane coupling agent. More specifically, the content of the first silane coupling agent herein refers to the total content of the first silane coupling agent in the case of adding the silica particles and the first silane coupling agent by an integral blend method; and the first silane coupling agent contained in the silica particles surface-treated with the first silane coupling agent. If the content of the first silane coupling agent is excessively low, the heat resistance, the moisture resistance, and the chemical resistance tend to be lowered. Specifically, the interlayer adhesive force and the adhesive force between the metal layer and the insulating layer are decreased, and there is a tendency for delamination and the like to occur at the time of heating. Alternatively, if the content of the first silane coupling agent is excessively high, excellent low dielectric properties are less likely to be obtained, and the heat resistance, the moisture resistance, and the chemical resistance tend to be decreased. Thus, the content of the first silane coupling agent within the range mentioned above can maintain excellent low dielectric properties, heat resistance, moisture resistance, and chemical resistance, even when the thermal conductivity is increased by the inclusion of silica particles.

In addition, in the manufacture of the resin composition, the silica particles surface-treated in advance with the first silane, coupling agent may be added, or the silica particles and the first silane coupling agent may be added by an integral blend method.

(Dispersant)

Furthermore, the resin composition may also contain a dispersant. The dispersant is not particularly limited, but examples thereof include a dispersant having an acidic group and a basic group, i.e., an amphoteric dispersant, and the like. This dispersant may be a dispersant having an acidic group and a basic property in one molecule, or a dispersant in which a molecule having an acidic group and a molecule having a basic group coexist. In addition, this dispersant has only to have an acidic group and a basic group, for example, may have another functional group. Examples of the other functional group include hydrophilic functional groups such as a hydroxyl group, and the like.

In addition, examples of the acidic group include a carboxyl group, an acid anhydride group, a sulfonic acid group (sulfo group), a thiol group, a phosphoric acid group, an acidic phosphoric acid ester group, a hydroxy group, a phosphonic acid group, and the like. As the acidic group, among the foregoing acidic groups, a phosphoric acid group, a carboxyl group, a hydroxy group, and a sulfo group are preferred, and a phosphoric acid group and a carboxyl group are more preferred.

In addition, examples of the basic group include ammonium bases such as an amino group, an imino group, and an alkylol ammonium base, an imidazoline group, a pyrrole group, an imidazole group, a benzimidazole group, a pyrazole group, a pyridine group, a pyrimidine group, a pyrazine group, a pyrrolidine group, a piperidine group, a piperazine group, an indole group, an indoline group, a purine group, a quinoline group, an isoquinoline group, a quinuclidine group, and a triazine group. As the basic group, among the foregoing basic groups, an amino group, an imidazoline group, an ammonium base, a pyrrole group, an imidazole group, a benzimidazole group, a pyrazole group, a pyridine group, a pyrimidine group, a pyrazine group, a pyrrolidine group, a piperidine group, a piperazine group, an indole group, an indoline group, a purine group, a quinoline group, an isoquinoline group, a quinuclidine group, and a triazine group are preferable, and an amino group and an imidazoline group are more preferred.

The dispersant may have one of the exemplified acidic groups as the acidic group, or may have two or more thereof. In addition, the dispersant may have one of the exemplified basic groups as the basic group, or may have two or more thereof.

Furthermore, as the dispersant, specifically, a dispersant having a phosphoric acid group and an imidazoline group, and a dispersant having a carboxyl group and an amino group are preferably used. In addition, examples of the dispersant having a phosphoric acid group and an imidazoline group include BYK-W969 manufactured by BYK Japan KK, and the like. In addition, examples of the dispersant having a carboxyl group and an amino group include BYK-W966 manufactured by BYK Japan KK, and the like.

Furthermore, the acid value of the dispersant is preferably 30 to 150 mg KOH/g, and more preferably 30 to 100 mg KOH/g, in terms of solid content. If the acid value is excessively small, it is not possible to sufficiently enhance the dispersibility of the silica particles, and the moldability tends to be deteriorated. If the acid value is excessively large, there is a tendency to decrease the heat resistance such as the Tg of the cured product, decrease the adhesive force, and degrade the electrical characteristics. It is to be noted that the acid value represents an acid value per grain of the dispersant solid content, and the acid value can be measured by a potentiometric titration method in accordance with DIN EN ISO 2114.

In addition, the amine value of the dispersant is preferably 30 to 150 mg KOH/g, and more preferably 30 to 100 mg KOH/g, in terms of solid content. In addition, the amine value is more preferably comparable to the acid value. If the amine value is excessively small as compared with the acid value, the influence of the acid value is increased, thereby adversely affecting the radical curing system, and there is thus a tendency to decrease the heat resistance such as the Tg of the cured product, decrease the adhesive force, and degrade the electrical characteristics. Alternatively, if the amine value is excessively large as compared with the acid value, the influence of the amine value is increased, thereby decreasing the dispersibility, and there is thus a tendency to deteriorate the moldability, or degrade the electrical characteristics of the cured product. It is to be noted that the amine value represents an amine value per gram of the dispersant solid content, and the amine value can be measured by a potentiometric titration method with the use of a 0.1 N aqueous solution of $HClO_4$ acetic acid in accordance with DIN16945.

The content of the dispersant is preferably 0.1 to 5 parts by mass, more preferably 0.3 to 3 parts by mass, and further preferably 0.5 to 2 parts by mass with respect to 100 parts by mass in total of the silica particles and the silica particles surface-treated with the first silane coupling agent. If the content of the dispersant is excessively low, the moldability of the resin composition tends to be decreased. This is believed to be due to the fact that the effect of the dispersant for enhancing the dispersibility of the silica particles in the organic component can be produced insufficiently. In addition, if the content of the dispersant is excessively large, there is a tendency to make it impossible to sufficiently enhance the heat resistance of the cured product. This is believed to be due to the fact that the hygroscopicity is excessively increased when the dispersant having both an acidic group and a basic group is contained in a large amount. Thus, the content of the dispersant within the range mentioned above makes it possible to obtain a resin composition which is excellent in the moldability and heat resistance of the cured product.

(Flame Retardant)

The resin composition may contain a flame retardant. In addition, the flame retardant may be a bromine-based flame retardant or a phosphorus-based flame retardant. For example, in fields required to be halogen-free, phosphorus-based flame retardants are preferred.

Examples of the bromine-based flame retardant specifically include ethylene dipentabromobenzene, ethylene bistetrabromoimide, decabromodiphenyl oxide, tetradecabromodiphenoxybenzene, ethylene bis(pentabromophenyl), bis(tribromophenoxy)ethane, and the like. Among these examples, ethylene bis(pentahromophenyl) is preferred.

Furthermore, examples of the phosphorus-based flame retardant include phosphoric acid ester-based flame retardants, phosphazene-based flame retardants, and phosphinate-based flame retardants. The phosphorus-based flame retardant preferably contains a compatible phosphorus compound that is compatible with a mixture of the modified polyphenylene ether compound and the crosslinkable curing agent, and an incompatible phosphorus compound that is incompatible with the mixture.

The compatible phosphorus compound is not particularly limited as long as the phosphorus compound acts as a flame retardant and is compatible with the mixture. In addition, the compatibility refers to, in this case, fine dispersion, for example, at the molecular level in the mixture of the modified polyphenylene ether compound and the crosslinkable curing agent. Examples of the compatible phosphorus compound include compounds containing phosphorus without forming any salt, such as a phosphoric acid compounds, phosphazene compounds, phosphorous ester compounds, phosphine compounds, and the like. Furthermore, examples of the phosphazene compound include cyclic or chain phosphazene compounds. It is to be noted that the cyclic phosphazene compound, which is also referred to as cyclophosphazene, is a compound having a double bond of phosphorus and nitrogen as constituent elements in the molecule, and having a cyclic structure. Moreover, examples of the phosphoric acid ester compound include triphenyl phosphate, tricresyl phosphate, xylenyl diphenyl phosphate, cresyl diphenyl phosphate, 1,3-phenylene bis(di 2,6-xylenyl phosphate), 9,10-dihydro-9-oxa-10-phosphaphenanthrene-10-oxide (DOPO), condensed phosphoric acid ester compounds such as aromatic condensed phosphoric acid ester compounds, cyclic phosphoric acid ester compounds, and the like. Moreover, examples of the phosphorous ester compound include trimethyl phosphite, triethyt phosphite, and the like. Moreover, examples the phosphine compound include tris-(4-methoxyphenyl)phosphine, triphenylphosphine, and the like. In addition, the compatible phosphorus compounds may be used alone, or two or more thereof may be used in combination. In addition, as the compatible phosphorus compound, the phosphazene compound is preferred among the examples mentioned above.

In addition, the incompatible phosphorus compound is not particularly limited as long as the incompatible phosphorus compound acts as a flame retardant and is incompatible with the mixture. In addition, the incompatibility refers to, in this case, a target (phosphorus compound) dispersed in the form of islands in the mixture of the modified polyphenylene ether compound and the crosslinkable curing agent without being compatible in the mixture. Examples of the incompatible phosphorus compound include salt-forming compounds containing phosphorus, such as phosphinate compounds, polyphosphate compounds, and phosphonium salt compounds, phosphine oxide compounds, and the like. Moreover, examples of the phosphinate compound include aluminum dialkylphosphinate, aluminum trisdiethylphosphinate, aluminum trismethylethylphosphinate, aluminum trisdiphenylphosphinate, zinc bisdiethylphosphinate, zinc bismethylethylphosphinate, zinc bisdiphenyiphosphinate, titanyl bisdiethylphosphinate, titanyl bismethylethylphosphinate, titanyl bisdiphenyiphosphinate, and the like. Moreover, examples of the polyphosphate compound include melamine polyphosphate, melam polyphosphate, melem polyphosphate, and the like. Moreover, examples of the phosphonium salt compound include tetraphenyl phosphonium tetraphenyl borate, tetraphenyl phosphonium bromide, and the like. Moreover, examples of the phosphine oxide compound include phosphine oxide compounds having a diphenyl phosphine oxide group in the molecule, and the like, and more specifically, phosphine oxide compounds having two or more diphenyl phosphine oxide groups in the molecule, and the like. In addition, the incompatible phosphorus compounds may be used alone, or two or more thereof may be used in combination. In addition, as the incompatible phosphorus compound, the phosphinate compound is preferred among the examples mentioned above.

In resin composition for use in the present embodiment as described above, the compatible phosphorus compound and the incompatible phosphorus compound are used in combination as a flame retardant, thereby making it possible to enhance the flame retardancy of the cured product obtained, as compared with the case of using only one of the compatible phosphorus compound and the incompatible phosphorus compound. Further, the combined use of the compatible phosphorus compound and the incompatible phosphorus compound is believed to be capable of enhancing the flame retardancy of the cured product obtained, while sufficiently suppressing the inhibition of the curing reaction between the modified polyphenylene ether compound and the crosslinkable curing agent. Furthermore, it is believed that since the inhibition of the curing reaction is sufficiently suppressed, the decrease in the heat resistance of the cured product can be also suppressed sufficiently. From the foregoing, the resin composition is believed to be excellent in the heat resistance and flame retardancy of the cured product. Alternatively, in a case where either the compatible phosphorus compound or the incompatible phosphorus compound is used as a flame retardant, there is a tendency to provide insufficient flame retardancy. In a case where either the compatible phosphorus compound or the incompatible phosphorus compound is used as a flame retardant, when an attempt is made to secure the same degree of flame retardancy as in the case of the combined use mentioned above, it is necessary to contain the compatible phosphorus compound or the incompatible phosphorus compound in a large amount. It is believed that merely increasing the content as just described without the combined use as the flame retardant is less likely to achieve excellent low dielectric properties, thereby decreasing the heat resistance or the like of the cured product. From the foregoing, when the above-mentioned combined use is adopted as the flame retardant, with the content as described later, the flame retardancy can be enhanced while maintaining excellent low dielectric properties, and suppressing the decrease in the heat resistance of the like of the cured product.

The content of the compatible phosphorus compound is 1 to 3.5 parts by mass, preferably 1 to 3 parts by mass, and more preferably 2 to 3 parts by mass, with respect to 100 parts by mass of the modified polyphenylene ether compound and the crosslinkable curing agent. If the amount of the compatible phosphorus compound is excessively small, there is a tendency to fail to sufficiently produce the effect of improving the flame retardancy by using the compatible phosphorus compound and the incompatible phosphorus compound in combination. Alternatively, if the amount of the compatible phosphorus compound is excessively large, there is a tendency to decrease the interlayer adhesion. Thus, containing the compatible phosphorus compound so as to reach the content mentioned above makes it possible to enhance the interlayer adhesion while enhancing the flame retardancy.

In addition, the content of the incompatible phosphorus compound is 14 to 30 parts by mass, preferably 14 to 25 parts by mass, and more preferably 14 to 22 parts by mass, with respect to 100 parts by mass of the modified polyphenylene ether compound and the crosslinkable curing agent. If the amount of the incompatible phosphorus compound is excessively small, there is a tendency to fail to sufficiently produce the effect of improving the flame retardancy by using the compatible phosphorus compound and the incompatible phosphorus compound in combination. In addition, if the amount of the incompatible phosphorus compound is excessively large, the total amount of the flame retardant will be excessively large, and there is a tendency to make excellent low dielectric properties less likely to be obtained, and decrease chemical resistance such as alkali resistance. Thus, containing the incompatible phosphorus compound so as to reach the content mentioned above makes it possible to sufficiently suppress the decrease in chemical-resistance or the like, while enhancing the flame retardancy and maintaining excellent low dielectric properties.

Furthermore, the content ratio between the compatible phosphorus compound and the incompatible phosphorus compound is preferably 3:97 to 20:80, more preferably 3:97 to 19:81, further preferably 5:95 to 15:85, and still more preferably 5:95 to 13:87 in ratio by mass. This content ratio provides a resin composition which is more excellent in the flame retardancy, interlayer adhesion, and chemical resistance of the cured product, while maintaining the excellent low dielectric properties of the polyphenylene ether. This is believed to be because the above-mentioned effect of using the compatible phosphorus compound and the incompatible phosphorus compound in combination as a flame retardant can be further produced while sufficiently suppressing decreases in interlayer adhesion and chemical resistance.

Furthermore, the flame retardant may be composed of the compatible phosphorus compound and the incompatible phosphorus compound, and may also contain, besides these two types, flame retardants.

Moreover, the resin composition may contain a filler other than the silica particles mentioned above. Examples of the filler include, but not particularly limited to, a filler and the like which are added to enhance the heat resistance and flame retardancy of the cured product of a curable composition and enhance the dimensional stability at the time of heating. More specifically, containing the filler can enhance the heat resistance and the flame retardancy, and enhance the dimensional stability at the time of heating. Examples of the filler, specifically, include metal oxides such as alumina, titanium oxide, and mica, metal hydroxides such as aluminum hydroxide and magnesium hydroxide, talc, aluminum borate, barium sulfate, calcium carbonate, and the like.

In addition, the resin composition for use in the present embodiment may contain an additive. Examples of the additive include antifoaming agents such as silicone-based antifoaming agents and acrylic acid ester-based antifoaming agents, antioxidants, heat stabilizers, antistatic agents, ultraviolet absorbers, dyes and pigments, lubricants, and the like.
(Metal Layer)

The surface of the metal layer in contact with the insulating layer surface-treated with a second silane coupling agent having an amino group in the molecule. More specifically, the metal layer includes a metal base material, and a surface treatment layer provided at least on the side of the metal base material closer to a contact surface in contact with the insulating layer. Examples of the metal layer 13 include, as shown in FIG. 1, a metal layer including a metal base material 14 and a surface treatment layer 15 provided on the side of the metal base material 14 closer to the contact surface 16 in contact with the insulating layer 12. The surface treatment layer 15 is a layer obtained by surface treatment of the metal base material 14 with the second Mane coupling agent. More specifically, the metal layer 13 includes the metal base material 14 and the surface treatment layer 15 obtained by surface treatment of, with the second silane coupling agent, at least the contact surface 16 of the metal base material 14 in contact with the insulating layer 12. In addition, the surface treatment layer 15 is preferably a layer provided at least on the entire contact surface 16 of the metal base material 14 in contact with the insulating layer 12. Moreover, the metal layer may include the surface treatment layer on both surfaces of the metal base material. Furthermore, the metal-clad laminated board is manufactured by, for example, stacking the metal layer on one or both sides of a prepreg that forms the insulating layer so as to bring the prepreg into contact with the surface treatment layer of the metal layer, and heating and pressuring the prepreg and the metal layer. From the foregoing, examples of the insulating layer include a layer obtained by curing the prepreg in contact with the surface treatment layer of the metal layer, and the like. In this case, the surface treatment layer may be formed as a layer that is reacted with the resin composition contained in the prepreg, and such a layer that is reacted with the resin composition contained in the prepreg is thus preferred as the surface treatment layer. Such a layer enhances the adhesion between the metal layer and the insulating layer.

In addition, the metal layer 13 is in contact with the insulating layer 12. More specifically, the surface treatment layer 15 of the metal layer 13 is in contact with the insulating layer 12. It is to be noted that in a case where a wiring board is manufactured from the metal-clad laminated board 11, the metal layer 13 serves as a wiring in the wiring board.

The second silane coupling agent is not particularly limited as long as the silane coupling agent has an amino group in the molecule. Examples of the second silane coupling agent include compounds having an amino group as a reactive functional group, and further having a hydrolyzable group such as a methoxy group or an ethoxy group, and the like. Specific examples of the second silane coupling agent include N-2-(aminoethyl)-3-aminopropylmethyldimethoxysilane, N-2-(aminoethyl)-3-aminopropylmethyldiethoxysilane, N-2-(aminoethyl)-3-aminopropylethyldiethoxysilane, N-2-(aminoethyl)-3-aminopropyltrimethoxysilane, N-2-(aminoethyl)-3-aminopropyltriethoxysilane, 3-aminopropyltrimethoxysilane, and 3-aminopropyltriethoxysilane.

The metal layer 13 in contact with the insulating layer 12 is capable of increasing the adhesive force to the insulating layer 12, by means of the surface treatment layer 15 obtained by the surface treatment of the metal material 14 with the second silane coupling agent.

The surface roughness of the metal layer 13 (the surface roughness of the contact surface 16) is preferably 3 μm or less, more preferably 2.5 μm or less, and more preferably 2 μm or less in ten-point average roughness Rz. The surface roughness of the contact surface 16 is preferably lower, that is, the smoothness of the metal layer 13 is preferably higher in that the loss during signal transmission can be reduced. On the other hand, the surface roughness of the contact surface 16 is limited to about 0.5 μm in ten-point average roughness Rz, even if the surface roughness is reduced. If the surface roughness of the contact surface 16 is excessively low, there is a tendency to decrease the adhesion between the metal layer 13 and the insulating layer 12. Also from this point of view, the surface roughness of the contact surface 16 is preferably 0.5 μm or more in ten-point average roughness Rz. Thus, the surface roughness of the contact surface 16 is preferably 0.5 to 3 μm, more preferably 0.6 to 2.5 μm, and further preferably 0.6 to 2 μm in ten-point average roughness Rz. In addition, since the metal layer 13 includes the metal base material 14 and the surface treatment layer 15 on the side of the metal base material 14 closer to the contact surface 16, the surface roughness of the contact surface 16 refers to the surface roughness of the surface treatment layer 15. In addition, the surface roughness of the metal base material 14 is not particularly limited. Even with the surface treatment layer 15 is formed, the surface roughness of the metal base material 14 is preferably comparable to the surface roughness of the contact surface 16 in a case where the surface roughness of the metal layer 13 does not vary significantly. It is to be noted that the ten-point average roughness Rz as surface roughness herein is in accordance with JIS B 0601: 1994, and can be measured with a common surface roughness measuring instrument or the like. Specifically, the ten-point average roughness Rz can be measured, for example, with the use of a surface roughness profile measuring machine (SURFCOM 500 DX) manufactured by Tokyo Seimitsu Co., Ltd.

Furthermore, the metal base material 14 is not particularly limited as long as the metal base material 14 is used as a metal layer for a metal-clad laminated board. Specifically, examples of the metal base material 14 include metal tails such as a copper foil, a nickel foil, and an aluminum foil, and the like. Among these examples, a copper foil is preferably used as the metal base material 14. More specifically, the metal-clad laminated board according to the present embodiment is preferably a copper foil-clad laminated board.

In addition, the thickness of the metal layer 13 varies depending on the performance or the like required for the finally obtained wiring board, and the thickness is not particularly limited. The thickness of the metal layer 13 is preferably 12 to 70 μm, for example.

For the metal-clad laminated board according to the present embodiment, the deterioration ratio of the peeling strength of the metal layer in the metal-clad laminated board after the acid treatment (post-acid treatment peeling strength) to the peeling strength of the metal layer in the metal-clad laminated board before the acid treatment (pre-acid treatment peeling strength) [=(pre-acid treatment peeling strength−post-acid treatment peeling strength)/pre-acid treatment peeling strength×100] is preferably 7% or less, and more preferably 6% or less. The deterioration ratio is preferably lower, and the deterioration ratio is preferably 0%. For this reason, the deterioration ratio is preferably 0 to 7%. Typically, when the metal-clad laminated board is subjected to an acid treatment, there is a tendency to decrease the peeling strength of the metal layer. On the other hand, in the case of the metal-clad laminated board according to the present embodiment, even after the acid treatment, the metal layer is unlikely to be peeled off to such an extent that the deterioration ratio falls within the range mentioned above. More specifically, the metal-clad laminated board according to the present embodiment is excellent in chemical resistance such as acid resistance. It is to be noted that examples of the method for measuring the peeling strength of the metal layer include a method similar to a method for measuring copper foil adhesive strength as described later. Examples of the acid treatment include a treatment of immersing the metal-clad laminated board in hydrochloric acid, and the like.

For the metal-clad laminated board according to the present embodiment, the deterioration ratio of the peeling strength of the metal layer in the metal-clad laminated board after the moisture absorption treatment (post-moisture absorption treatment peeling strength) to the peeling strength of the metal layer in the metal-clad laminated board before the moisture absorption treatment (pre-moisture absorption treatment peeling strength)[=(pre-moisture absorption treatment peeling strength−post-moisture absorption treatment peeling strength)/pre-moisture absorption treatment peeling strength×100] is preferably 10% or less, and more preferably 9% or less. The deterioration ratio is preferably lower, and the deterioration ratio is preferably 0%. For this reason, the deterioration ratio is preferably 0 to 10%. Typically, when the metal-clad laminated board is subjected to a moisture absorption treatment, there is a tendency to decrease the peeling strength of the metal layer. On the other hand, in the case of the metal-clad laminated board according to the present embodiment, even after the moisture absorption treatment, the metal layer is unlikely to be peeled off to such an extent that the deterioration ratio falls within the range mentioned above. More specifically, the metal-clad laminated board according to the present embodiment is excellent in moisture resistance. It is to be noted that examples of the method for measuring the peeling strength of the metal layer include a method similar to a method for measuring copper foil adhesive strength as described later. Examples of the moisture absorption treatment include a treatment of immersing the metal-clad laminated board in warm water, and the like.

The resin composition for use in the present embodiment may be prepared in the form of varnish and used. For example, in making a prepreg, the resin composition may be prepared in the form of a varnish and used for the purpose of impregnating a base material (fibrous base material) for forming the prepreg. More specifically, the resin composition may be used as a composition prepared in the form of varnish (resin varnish). In addition, in the resin composition for use in the present embodiment, the modified polyphenylene ether compound and the crosslinkable curing agent are dissolved in a resin varnish. Such a composition in the form of varnish (resin varnish) is prepared, for example, as follows.

First, each component that can be dissolved in an organic solvent is put into the organic solvent and then dissolved therein. In this regard, heating may be carried out, if necessary. Thereafter, a component that is insoluble in the organic solvent, for use if necessary, is added, and dispersed with the use of a ball mill, bead mill, a planetary mixer, a roll mill, or the like until reaching a predetermined dispersed state, thereby preparing a composition in the form of varnish. The organic solvent used herein is not particularly limited as long as the organic solvent dissolves the modified polyphenylene ether compound and the crosslinkable curing agent, but does not inhibit the curing reaction. Specifically, examples of the organic solvent include toluene, methyl ethyl ketone (MEK), and the like.

In addition, as described above, the insulating layer may include not only the cured product of the resin composition, but also a fibrous base material. Examples of the fibrous base material include a material similar to a fibrous base material included in a prepreg described later.

Moreover, the use of the resin composition can provide not only the metal-clad laminated board, but also a prepreg, a metal member with resin (metal foil with resin), and a wiring board as follows. In this regard, a composition in the form of varnish as mentioned above may be used as the resin composition.

The prepreg includes a semi-cured product of the resin composition and a fibrous base material. Examples of the prepreg include the semi-cured product which has a fibrous base material present therein. More specifically, this prepreg includes the semi-cured product and the fibrous base material present in the semi-cured product.

It is to be noted that the semi-cured product refers to a partially cured product to such an extent that the resin composition can be further cured. More specifically, the semi-cured product refers to a semi-cured resin composition (B-stage resin composition). For example, the resin composition undergoes, on heating, a gradual decrease in viscosity at first, and then, starts to be cured, and undergoes a gradual increase in viscosity. In such a case, examples of the semi-curing include the state from the start of viscosity increase before complete curing.

In addition, the prepreg may be a prepreg including a semi-cured product of the resin composition as mentioned above, or a prepreg, including the resin composition itself which is not cured. More specifically, the prepreg may be a prepreg including a semi-cured product of the resin composition (B-stage resin composition) and a fibrous base material, or the resin composition before curing (A-stage resin composition) and a fibrous base material.

The method for making the prepreg is not particularly limited as long as the method is capable of making the prepreg. Examples of the method include a method of impregnating a fibrous base material with the resin composition, for example, the resin composition prepared in the form of varnish, and the like. More specifically, examples of the prepreg include a prepreg obtained by impregnating a fibrous base material with the resin composition, and the like. The method for the impregnation is not particularly limited as long as the method can impregnate a fibrous base material with the resin composition. Examples of the method include not only dipping, but also methods that use roll coating, die coating, and bar coating, spraying, and the like. Moreover, as a method for making the prepreg, the fibrous base material impregnated with the resin composition may be dried or heated after the impregnation. More specifically, examples of the method for making a prepreg, a method of impregnating a fibrous base material with the resin composition prepared in the form of varnish and then drying the composition, a method of impregnating a fibrous base material with the resin composition prepared in the form of varnish and then heating the composition, a method of impregnating a fibrous base material with the resin composition prepared in the form of varnish, drying and then heating the composition, and the like.

Examples of the fibrous base material for use in making the prepreg include, specifically, glass cloth, aramid cloth, polyester cloth, glass nonwoven fabric, aramid nonwoven fabric, polyester nonwoven fabric, pulp paper, and linter paper. Further, when a glass cloth is used, a laminated board is obtained which is excellent in mechanical strength, and in particular, a glass cloth subjected to a flattening process is preferred. The flattening process can be performed by, specifically, for example, continuously pressing the glass cloth with a press roll under appropriate pressure to compress the yarn into a flattened form. It is to be noted that a fibrous base material can be typically used which is, for example, 0.04 to 0.3 mm in thickness.

The fibrous base material is impregnated with the resin composition by immersion and application, or the like. It is also possible to repeat this impregnation more than once, if necessary. Alternatively, in this regard, it is also possible to repeat the impregnation with the use of multiple resin compositions that differ in composition or concentration, thereby finally adjusting the compositions to the desired composition and impregnation amount.

The fibrous base material impregnated with the resin composition is heated under a desired heating condition, for example, at 80 to 180° C. for 1 to 10 minutes, thereby providing a pre-cured (A-stage) or semi-cured (B-stage) prepreg.

Such a prepreg can manufacture a metal-clad laminated board, a wiring board, or the like which has low dielectric constant and dielectric properties and excellent heat resistance, moisture resistance, and chemical resistance.

The method for manufacturing the metal-clad laminated board according to the present embodiment is not particularly limited as long as the method is capable of manufacturing the metal-clad laminated board. As a method for manufacturing the metal-clad laminated board, for example, the metal-clad laminated board can be obtained in a similar manner to a common method for manufacturing a metal-clad laminated board, except for the use of the resin composition. Examples of the method include a method that uses the prepreg, obtained with the use of the resin composition, and the like. Examples of the method for manufacturing the metal-clad laminated board with the use of a prepreg include a method of stacking one or more prepregs, further stacking, one or both upper and lower surfaces thereof, the metal layer such that the surface treatment layer of the metal layer is brought into contact with the prepreg, and laminating and then integrating the prepreg and the metal layer by pressure molding while heating, and the like. More specifically, the method for manufacturing the metal-clad laminated board include the steps of: obtaining the resin composition; impregnating a fibrous base material with the resin composition to obtain a prepreg; and laminating a metal layer on the prepreg and processing the prepreg and the metal layer by pressure molding while heating to obtain a metal-clad laminated board including an insulating layer including a cured product of the resin composition and a metal layer present in contact with at least one surface of the insulating layer. This method is capable of preparing a metal-clad laminated board provided with a metal layer on both sides or a metal-clad laminated board provided with a metal layer on one side. More specifically, the metal-clad laminated board according to the present embodiment is obtained by laminating the metal layer on the prepreg so as to bring the surface treatment layer of the metal layer and the prepreg into contact with each other, and processing the prepreg and the metal layer by pressure molding while heating. In addition, the conditions for the pressure while heating can be appropriately set depending on the thickness of the laminated board to be manufactured, the type of the resin composition included in the prepreg, and the like. For example, the temperature may be 170 to 210° C., the pressure may be 3.5 to 4 MPa, and the time may be 60 to 150 minutes. Alternatively, the metal-clad laminated board may be manufactured without using any prepreg. Examples thereof include a method of applying the resin composition in the form of varnish, or the like onto the surface treatment layer of the metal layer, forming a layer including a curable composition on the surface treatment layer of the metal layer, and then processing the layers by pressure while heating.

[Metal Member with Resin]

Figure 2:
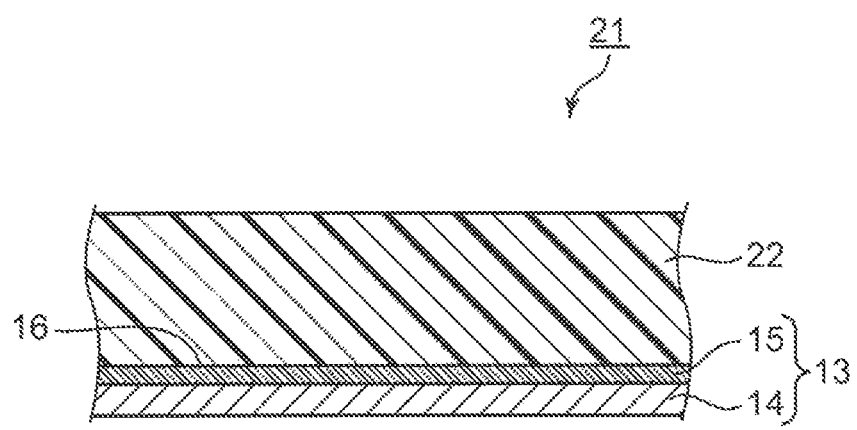
FIG. 2 is a cross-sectional view illustrating a configuration of a metal member with resin according to another embodiment of the present invention.

The metal member with resin (metal foil with resin) according to another embodiment of the present invention includes a resin layer and a metal layer present in contact with one surface of the resin layer. Examples of a metal member with resin (metal foil with resin) 21 include, as shown in FIG. 2, a member including a resin layer 22 and a metal layer 13 disposed in contact with one surface of the resin layer 22. It is to be noted that FIG. 2 is a cross-sectional view illustrating the configuration of the metal member with resin 21 according to the present embodiment.

In addition, the resin layer 22 includes the resin composition (A-stage resin composition) or the semi-cured product of the resin composition (B-stage resin composition) as mentioned above. Further, the resin layer has only to include the resin composition or the semi-cured product of the resin composition, and may or may not include a fibrous base material. Furthermore, a fibrous base material similar to that of the prepreg can be used as the fibrous base material.

In addition, the metal layer 13 is a metal layer similar to that provided for the metal-clad laminated board. Specifically, as shown in FIG. 2, the metal layer 13 also includes a metal base material 14 and a surface treatment layer 15 provided at least on the side of the metal base material 14 closer to a contact surface 16 in contact with the resin layer 22. Further, the surface treatment layer 15 is a layer obtained by surface treatment of the metal base material 14 with the second silane coupling agent. Furthermore, examples of the metal base material 14 include metal foils similar to those in the case of the metal-clad laminated board, and above all, a copper foil is used preferably. More specifically, examples of the metal member with resin according to the present embodiment include a metal foil with resin, and a copper foil with resin is preferred.

In addition, the method for manufacturing the metal member with resin according to the present embodiment is not particularly limited as long as the method is capable of manufacturing the metal member with resin. As a method for manufacturing the metal member with resin, the metal member with resin can be obtained in a similar manner to a common method for manufacturing a metal member with resin, except for the use of the resin composition. Examples of the method include a method of applying the resin composition, for example, the resin composition prepared in the form varnish onto the metal layer, and the like. More specifically, examples of the metal member with resin according to the embodiment of the present invention include a member obtained by applying the resin composition onto the metal layer, and the like. The method for applying the resin composition is not particularly limited as long as the method is capable of applying the resin composition to the metal layer. Examples of the method include methods that use roll coating, die coating, and bar coating, spraying, and the like. Moreover, as a method for manufacturing the metal member with resin, the metal layer with the resin composition applied thereto may be dried or heated after the application. More specifically, examples of the method for manufacturing the metal member with resin, a method of applying the resin composition prepared in the form of varnish to the metal layer and then drying the composition, a method of applying the resin composition prepared in the form of varnish to the metal layer and then heating the composition, a method of applying the resin composition prepared in the form of varnish to the metal layer, and drying and then heating the composition, and the like. It is to be noted that the metal layer with the resin composition applied thereto is heated under a desired heating condition, for example, at 80 to 180° C. for 1 to 10 minutes, thereby providing a pre-heated (A-stage) or semi-cured (B-stage) metal member with resin.

Such a metal member with resin is, as with the metal-clad laminated board, a metal member with resin which is low in dielectric constant and dielectric properties, high in thermal conductivity, and excellent in heat resistance, moisture resistance, and chemical resistance.

[Wiring Board]

The wiring board according to another embodiment of the present invention includes an insulating layer and a wiring present in contact with at least one surface of the insulating layer. More specifically, the wiring board has a wiring on the surface of the insulating layer. Examples of this wiring board 31 include, as shown in FIG. 3, a wiring board including an insulating layer 12 and a wiring 17 disposed in contact with both surfaces of the insulating layer 12. In addition, the wiring board may include a wiring in contact with only one surface of the insulating layer. It is to be noted that FIG. 3 is a cross-sectional view illustrating the configuration of the wiring board 31 according to the present embodiment.

The wiring 17 includes, as shown in FIG. 3, a metal base material 18, and a surface treatment layer 19 provided at least on the side of the metal base material 18 closer to a contact surface 20 in contact with the insulating layer 12. Moreover, examples of the insulating layer 12 include a layer similar to the insulating layer of the metal-clad laminated board. In addition, examples of the wiring 17 include a wiring formed by partially removing the metal layer of the metal-clad laminated board, and the like. In addition, examples of such a wiring include wiring and the like formed by methods through the use of subtractive, additive, and semiadditive methods, chemical mechanical polishing (CMP), trench, ink jet, squeegee, transfer, and the like.

The method for manufacturing the wiring board according to the present embodiment is not particularly limited as long as the method is capable of manufacturing the wiring board with the use of the metal-clad laminated board or the metal member with resin. Examples of the method for manufacturing the wiring board include a method with the use of a common metal-clad laminated board, and the like. Examples of the method of preparing a wiring board with the use of a metal-clad laminated board include a method of forming a circuit by etching a metal layer at the surface of the metal-clad laminated body. This method makes it possible to obtain a wiring board provided with a conductor pattern as a circuit at the surface of the metal-clad laminated board. More specifically, the wiring board according to the present embodiment is obtained by circuit formation of partially removing the metal layer at the surface of the metal-clad laminated hoard. Examples of the method for manufacturing the wiring board include a method including the steps of: obtaining the resin composition; impregnating a fibrous base material with the resin composition to obtain a prepreg; laminating a metal layer on the prepreg and processing the prepreg and the metal layer by pressure molding while heating to obtain a metal-clad laminated board including an insulating layer including a cured product of the resin composition and a metal layer present in contact with at least one surface of the insulating layer; and partially removing the metal layer of the metal-clad laminated board to form a wiring present in contact with at least one surface of the insulating layer, and the like.

Such a wiring board is a wiring board which is low in dielectric constant and dielectric properties, high in thermal conductivity, and excellent in heat resistance, moisture resistance, and chemical resistance.

This specification discloses various aspects of the technology as described above, and the main aspects of the technology will be summarized below.

One aspect of the present invention is a metal-clad laminated board including an insulating layer and a metal layer present in contact with at least one surface of the insulating layer, in which the insulating layer includes a cured product of a resin composition containing a modified polyphenylene ether compound terminally modified with a substituent having a carbon-carbon unsaturated double bond; a crosslinkable curing agent having a carbon-carbon unsaturated double bond in a molecule; a first silane coupling agent having a carbon-carbon unsaturated double bond in a molecule; and at least one of silica particles and silica particles surface-treated with the first silane coupling agent, a total content of the silica particles and the silica particles surface-treated with the first silane coupling agent is 40 to 250 parts by mass with respect to 100 parts by mass in total of the modified polyphenylene ether compound and the crosslinkable curing agent, a total content of the first silane coupling agent contained in the resin composition and the first silane coupling agent contained in the silica particles surface-treated with the first silane coupling agent is 0.2 to 5 parts by mass with respect to 100 parts by mass in total of the silica particles and the silica particles surface-treated with the first silane coupling agent, and a contact surface of the metal layer in contact with the insulating layer is surface-treated with a second silane coupling agent having an amino group in a molecule.

Such a configuration can provide a metal-clad laminated board which is low in dielectric constant and dielectric properties, high in thermal conductivity, and excellent in heat resistance, moisture resistance, and chemical resistance.

Further, in the metal-clad laminated board, the deterioration ratio of the peeling strength of the metal layer in the metal-clad laminated board after the acid treatment to the peeling strength of the metal layer in the metal-clad laminated board before the acid treatment is preferably 7% or less.

Such a configuration provides a metal-clad laminated board which is low in dielectric constant and dielectric properties, high in thermal conductivity, and excellent in heat resistance and moisture resistance, and more excellent in chemical resistance.

Further, in the metal-clad laminated board, the deterioration ratio of the peeling strength of the metal layer in the metal-clad laminated board after the moisture absorption treatment to the peeling strength of the metal layer in the metal-clad laminated board before the moisture absorption treatment is preferably 10% or less.

Such a configuration provides a metal-clad laminated board which is low in dielectric constant and dielectric properties, high in thermal conductivity, and excellent in heat resistance and chemical resistance, and more excellent in moisture resistance.

Further, in the metal-clad laminated board, the first silane coupling agent preferably has at least one functional group selected from the group consisting of a methacryloxy group, a styryl group, a vinyl group, and an acryloxy group.

Such a configuration provides a metal-clad laminated board which is low in dielectric constant and dielectric properties, high in thermal conductivity, and more excellent in heat resistance, moisture resistance, and chemical resistance. This is believed to be because the interlayer adhesive force and the adhesive force between the metal layer and the insulating layer can be increased.

Moreover, in the metal-clad laminated board, the resin composition preferably further contains a dispersant.

Such a configuration provides a metal-clad laminated board which is low in dielectric constant and dielectric properties, high in thermal conductivity, and more excellent in heat resistance, moisture resistance, and chemical resistance. This is believed to be because the interlayer adhesive force and the adhesive force between the metal layer and the insulating layer can be increased.

Further, in the metal-clad laminated board, the resin composition preferably further contains a flame retardant, and the flame retardant is preferably at least one of a bromine-based flame retardant and a phosphorus-based flame retardant.

Such a configuration provides a metal-clad laminated board which is low in dielectric constant and dielectric properties, high in thermal conductivity, excellent in heat resistance, moisture resistance, and chemical resistance, and further excellent in flame retardancy. Furthermore, even if the flame retardant contained is a bromine-based flame retardant or a phosphorus-based flame retardant, the flame retardancy can be enhanced while maintaining the performance of low dielectric constant and dielectric properties, high thermal conductivity; and excellent heat resistance, moisture resistance, and chemical resistance.

Further, in the metal-clad laminated board, the phosphorus-based flame retardant preferably contains a compatible phosphorus compound that is compatible with a mixture of the modified polyphenylene ether compound and the crosslinkable curing agent; and an incompatible phosphorus compound that is not compatible with the mixture.

Such a configuration can provide low dielectric constant and dielectric properties, high thermal conductivity, and excellent heat resistance, moisture resistance, and chemical resistance, and further enhance the flame retardancy.

In addition, another aspect of the present invention is a metal member with resin, including an insulating layer and a metal layer present in contact with at least one surface of the insulating layer, in which the insulating layer includes a resin composition containing a modified polyphenylene ether compound terminally modified with a substituent having a carbon-carbon unsaturated double bond; a crosslinkable curing agent having a carbon-carbon unsaturated double bond in a molecule; a first silane coupling agent having a carbon-carbon unsaturated double bond in a molecule; and at least one of silica particles and silica particles surface-treated with the first silane coupling agent, or a semi-cured product of the resin composition, a total content of the silica particles and the silica particles surface-treated with the first silane coupling agent is 40 to 250 parts by mass with respect to 100 parts by mass in total of the modified polyphenylene ether compound and the crosslinkable curing agent, a total content of the first silane coupling agent contained in the resin composition and the first silane coupling agent contained in the silica particles surface-treated with the first silane coupling agent is 0.2 to 5 parts by mass with respect to 100 parts by mass in total of the silica particles and the silica particles surface-treated with the first silane coupling agent, and a contact surface of the metal layer in contact with the insulating layer is surface-treated with a second silane coupling agent having an amino group in a molecule.

Such a configuration can provide a metal member with resin which is, as with the metal-clad laminated board, low in dielectric constant and dielectric properties, high in thermal conductivity, and excellent in heat resistance, moisture resistance, and chemical resistance.

In addition, another aspect of the present invention is a wiring board including an insulating layer and a wiring present in contact with at least one surface of the insulating layer, in which the insulating layer includes a cured product of a resin composition containing a modified polyphenylene ether compound terminally modified with a substituent having a carbon-carbon unsaturated double bond; a crosslinkable curing agent having a carbon-carbon unsaturated double bond in a molecule; a first silane coupling agent having a carbon-carbon unsaturated double bond in a molecule; and at least one of silica particles and silica particles surface-treated with the first silane coupling agent, a total content of the silica particles and the silica particles surface-treated with the first silane coupling agent is 40 to 250 parts by mass with respect to 100 parts by mass in total of the modified polyphenylene ether compound and the crosslinkable curing agent, a total content of the first silane coupling agent contained in the resin composition and the first silane coupling agent contained in the silica particles surface-treated with the first silane coupling agent is 0.2 to 5 parts by mass with respect to 100 parts by mass in total of the silica particles and the silica particles surface-treated with the first silane coupling agent, and a contact surface of the wiring in contact with the insulating layer is surface-treated with a second silane coupling agent having an amino group in a molecule.

Such a configuration can provide a wiring board which is, as with the metal-clad laminated board, low in dielectric constant and dielectric properties, high in thermal conductivity, and excellent in heat resistance, moisture resistance, and chemical resistance.

The present invention can provide a metal-clad laminated board, a metal member with resin, and a wiring board which are low in dielectric constant and dielectric properties, high in thermal conductivity, and excellent in heat resistance, moisture resistance, and chemical resistance.

The present invention will be more specifically described with reference to examples, but the scope of the present invention is not limited thereto.

EXAMPLES

Examples 1 to 27 and Comparative Examples 1 to 11

Each component for use in the preparation of resin compositions in the present examples will be described.
(Polyphenylene Ether Compound: PPE Component)
Modified PPE-1:

modified polyphenylene ether in which a terminal hydroxyl group of polyphenylene ether is modified with a methacryl group (modified polyphenylene ether compound, SA9000 manufactured by SABIC Innovative Plastics, weight average molecular weight Mw: 1700, the number of terminal functional groups: 2, the modified polyphenylene ether compound represented by the above formula (12), where $R^8$ represents a methyl group, and Y represents a dimethylmethylene group (represented by the formula (9), a group where $R^9$ and $R^{10}$ in the formula (9) each represent a methyl group))

Modified PPE-2:

Modified Polyphenylene Ether Obtained by Reacting Polyphenylene Ether with Chloromethylstyrene.

Specifically, the modified polyphenylene ether is obtained by the reaction as follows.

First, 200 g of polyphenylene ether (SA90 manufactured by SABIC Innovative Plastics, the number of terminal hydroxyl groups: 2, weight average molecular weight Mw: 1700), 30 g of a mixture of p-chloromethylstyrene and m-chloromethylstyrene at 50:50 in ratio by mass (chloromethylstyrene: CMS manufactured by Tokyo Chemical Industry Co., Ltd.), 1.227 g of tetra-n-butylammonium bromide as a phase transfer catalyst, and 400 g of toluene were put into a 1-liter three-necked flask equipped with a temperature controller, a stirrer, a cooling system, and a dropping funnel, and stirred. Then, polyphenylene ether, chloromethylstyrene, and tetra-n-butylammonium bromide were stirred until being dissolved in toluene. In that regard, the liquid was gradually heated until the liquid temperature reached 75° C. finally. Then, as an alkali metal hydroxide, an aqueous solution of sodium hydroxide (20 g of sodium hydroxide/20 g of water) was added dropwise into the solution over 20 minutes. Thereafter, the mixture was further stirred at 75° C. for 4 hours. Next, after neutralizing the content in the flask with 10% by mass hydrochloric acid, a large amount of methanol was put. Thus, a precipitate was produced in the liquid in the flask. More specifically, the product contained in the reaction solution in the flask was reprecipitated. Then, this precipitate was taken out by filtration, washed three times with a mixed liquid of methanol and water at 80:20 in ratio by mass, and then dried at 80° C. for 3 hours under reduced pressure.

The obtained solid was analyzed by $^1$H-NMR (400 MHz, CDCl$_3$, TMS). As a result of the NMR measurement, a peak derived from the vinylbenzyl group (ethenylbenzyl group) was confirmed at 5 to 7 ppm. Thus, it was confirmed that the obtained solid is a modified polyphenylene ether having a vinylbenzyl group as the substituent at the molecule terminal. Specifically, it was confirmed that the solid is an ethenylbenzylated polyphenylene ether. This obtained modified polyphenylene ether compound is a modified polyphenylene ether compound represented by the above formula (11), where Y represents a dimethylmethylene group (represented by the formula (9), $R^9$ and $R^{10}$ in the formula (9) each represent a methyl group), Z represents a phenylene group, $R^1$ to $R^3$ each represent a hydrogen atom, and a is 0.

Further, the number of terminal functional groups of the modified polyphenylene ether was measured as follows.

First, the modified polyphenylene ether was accurately weighed. The weight at that time is regarded as X (mg). Then, this weighed modified polyphenylene ether was dissolved in 25 mL of methylene chloride, and after adding 100 μL of a solution of 10% by mass tetraethylammonium hydroxide (TEAH) in ethanol (TEAH:ethanol (volume ratio)=15:85) to the solution, the absorbance (Abs) at 318 nm was measured with the use of a UV spectrophotometer (UV-1600 manufactured by Shimadzu Corporation). Then, from the measurement result, the number of terminal hydroxyl group of the modified polyphenylene ether was calculated with the use of the following formula.

Amount of Residual OH(μmol/g)=[(25×Abs)/(ε× OPL×X)]×10$^6$ where ε indicates an absorption coefficient, which is 4700 L/mol·cm. In addition, OPL indicates a cell optical path length, which is 1 cm.

Further, the thus calculated amount of residual OH (the number of terminal hydroxyl groups) of the modified polyphenylene ether was almost zero, it was thus found that the hydroxyl groups of the polyphenylene ether before the modification were substantially modified. From the foregoing, it was found that the decrease from the number of terminal hydroxyl groups of the polyphenylene other before the modification referred to the number of terminal hydroxyl groups of the polyphenylene ether before the modification. More specifically, it was found that the number of terminal hydroxyl groups of the polyphenylene ether before the modification referred to the number of terminal functional groups of the modified polyphenylene ether. Even more specifically, the number of terminal functional groups was two.

Further, the intrinsic viscosity (IV) of the modified polyphenylene ether was measured in methylene chloride at 25° C. Specifically, the intrinsic viscosity (IV) of the modified polyphenylene ether was measured in a 0.18 g/45 ml methylene chloride solution of the modified polyphenylene ether (liquid temperature: 25° C.) with a viscometer (AVS 500 Visco System manufactured by Schott). As a result, the intrinsic viscosity (IV) of the modified polyphenylene ether was 0.086 dl/g.

Further, the molecular weight distribution of the modified polyphenylene ether was measured with the use of GPC. Then, the weight average molecular weight (Mw) was calculated from the obtained molecular weight distribution. As a result, Mw was 1900.

(Crosslinkable Curing Agent)

TAIC: triallyl isocyanurate (TAIC manufactured by Nippon Kasei Co., Ltd., weight average molecular weight Mw: 249, the number of terminal double bonds: 3)

DVB: divinylbenzene (DVB-810 manufactured by Nippon Steel & Sumitomo Metal Co., Ltd., molecular weight: 130)

(First Silane Coupling Agent Added to Resin Composition: First Silane Coupling Agent having Carbon-Carbon Unsaturated Double Bond in Molecule)

methacryloxy group: silane coupling agent having a methacryloxy group in the molecule (3-methacryloxypropyltrinaethoxysilane, KBM-503 manufactured by Shin-Etsu Chemical Co., Ltd.)

styryl group: silane coupling agent having a styryl group in the molecule (p-styryltrimethoxysilane, KBM-1403 manufactured by Shin-Etsu Chemical Co., Ltd.)

vinyl group: silane coupling agent having a vinyl group in molecule (vinyltriethoxysilane, KBM-1003 manufactured by Shin-Etsu Chemical Co., Ltd.)

acryloxy group: silane coupling agent having an acryloxy group in the molecule (3-acryloxypropyltrimethoxysilane, KBM-5103 manufactured by Shin-Etsu Chemical Co., Ltd.)
(First Silane Coupling Agent Added to Resin Composition: First Silane Coupling Agent having No Carbon-Carbon Unsaturated Double Bond in Molecule)

glycidoxy group: silane coupling agent having a glycidoxy group in the molecule (3-glycidoxypropyltriethoxysilane, KBM-403 manufactured by Shin-Etsu Chemical Co., Ltd.)

amino group: silane coupling agent having an amino group in the molecule (3-aminopropyltriethoxysilane, KBM-903 manufactured by Shin-Etsu Chemical Co., Ltd.)
(Reaction Initiator)

Peroxide: 1,3-bis(butylperoxyisopropyl)benzene (Perbutyl P manufactured by NOF Corporation)
(Filler)

Silica Particles Surface-Treated with First Silane Coupling Agent

Silica-1: silica particles surface-treated with a first silane coupling agent (silica particles surface-treated with a silane coupling agent having a vinyl group in the molecule, SC-2300SVJ manufactured by Admatechs Company Limited)

Silica Particles Surface-Treated with No First Silane Coupling Agent

Silica-2: silica particles surface-treated with no first silane coupling agent (SO-25R manufactured by Admatechs Company Limited)

Silica-3: silica particles surface-treated with no first silane coupling agent (Megasil 525 manufactured by Shiverco)
(Flame Retardant: Incompatible Phosphorus Compound)

Phosphinate compound: aluminum tris-diethylphosphinate (Exolit OP-935 manufactured by Clariant (Japan) K.K.: phosphorus concentration: 23% by mass)
(Flame Retardant: Compatible Phosphorus Compound)

Phosphazene compound: cyclic phosphazene compound (SPB-100 manufactured by Otsuka Chemical Co., Ltd.: phosphorus concentration: 13% by mass)
(Flame Retardant: Bromine-Based Flame Retardant)

Bromine-based compounds: ethylene bis(pentabromophenyl) (SAYTEX 8010 manufactured by Albemarle Japan Corporation)
(Dispersant)

Dispersant: Dispersant having a phosphoric acid group and an imidazoline group (BYK-W969 manufactured by BYK japan KK, acid value (in terms of solid content) 75 mg KOH/g, amine value (in terms of solid content) 75 mg KOH/g)
[Method for Preparing Resin Composition]

Next, a method for preparing the resin composition will be described.

First, respective components other than the reaction initiator were added to toluene in the blending proportions listed in Tables 1 to 3 such that the solid content concentration reached 60 mass %, and mixed. The mixtures were heated until reaching 80° C., and stirred for 60 minutes while keeping at 80° C. Thereafter, the stirred mixture was cooled down to 40° C., and then, the reaction initiator was added thereto in the blending proportions listed in Tables 1 to 3, thereby providing curable compositions in the form of varnish (varnishes). The mixtures were stirred for 60 minutes to prepare resin compositions in the form of varnish (varnishes).

[Method for Preparing Metal-Clad Laminated Board]

Next, glass clothes were impregnated with the obtained varnish, and dried by heating at 100 to 170° C. for about 3 to 6 minutes, thereby preparing prepregs. Specifically, the glass clothes are available from 142116-type E glass manufactured by Nitto Boseki Co., Ltd. In that regard, the content (resin content) of components constituting the resin through the curing reaction, such as polyphenylene ether compounds, e.g. the modified polyphenylene ether, and the curing agent, was adjusted so as to be about 50% by mass.

Next, two of the resulting prepregs were stacked, and on both sides thereof, the following copper foil was disposed as the metal layer to provide a body to be pressurized, and the body was heated and pressurized for 100 minutes under the conditions of temperature: 200° C. and pressure: 3 megapascal (MPa) to prepare a copper foil-clad laminated board (metal-clad laminated board) with the copper foil adhesively attached to both surfaces.
(Metal Layer: Copper Foil)

Copper foil-1: copper foil (copper foil subjected to aminosilane treatment, ten-point average roughness Rz: 2.5 μm, thickness: 35 μm) entirely surface-treated with a silane coupling agent having an amino group in the molecule (3-aminopropyltriethoxysilane, KBE-903 manufactured by Shin-Etsu Chemical Co., Ltd.)

Copper foil-2: copper foil (copper foil subjected to aminosilane treatment, ten-point average roughness Rz: 1.5 μm, thickness: 35 μm) entirely surface-treated with a silane coupling agent having an amino group in the molecule (3-aminopropyltriethoxysilane, KBE-903 manufactured by Shin-Etsu Chemical Co., Ltd.)

Copper foil-3: copper foil (copper foil subjected to epoxysilane treatment, ten-point average roughness Rz: 2.5 μm, thickness: 35 μm) entirely surface-treated with a silane coupling agent having an epoxy group in the molecule 3-glycidoxypropyltrimethoxysilane, KBM-403 manufactured by Shin-Etsu Chemical Co., Ltd.)

Copper foil-4: copper foil (copper foil subjected to styrylsilane treatment, ten-point average roughness Rz: 1.5 μm, thickness: 35 μm) entirely surface-treated with a silane coupling agent having a styryl group in the molecule (p-styryltrimethoxysilane, KBM-1403 manufactured by Shin-Etsu Chemical Co., Ltd.)

Copper foil-5: copper foil (copper foil subjected to vinylsilane treatment, ten-point average roughness Rz: 1.5 μm, thickness: 35 μm) entirely surface-treated with a silane coupling agent having a vinyl group in the molecule (vinyltrimethoxysilane, KBM-1003 manufactured by Shin-Etsu Chemical Co., Ltd.)
[Evaluation]

The respective prepregs and metal-clad laminated boards (evaluation boards) prepared as mentioned above were evaluated by the following methods.
[Thermal Conductivity]

The thermal conductivity (W/m·K) of the metal-clad laminated board was measured by a laser flash method.
[Interlayer Adhesive Strength]

First, of the multilayer metal-clad laminated board obtained by laminating the prepregs, the uppermost insulating layers were peeled off from each other, and the strength (interlayer adhesive strength) at that time was measured in accordance with JIS C 6481. The layers were peeled off at a speed of 50 mm/min with a tensile tester, and the peeling strength (copper foil adhesive strength) at that time was measured. The unit of measurement is N/mm. It is to be noted that with the high adhesive strength of, for example, 0.6 N/mm or more, when an attempt is made to peel off the uppermost insulating layers, peeling is not caused at the interface between the insulating layer and the insulating layer, but the insulating layers are destroyed. More specifically, a cohesive failure is caused. In addition, with the low adhesive strength of, for example, less than 0.6 N/mm, when an attempt is made to peel off the uppermost insulating layers, peeling is caused at the interface between the insulating layer and the insulating layer. More specifically, an interfacial fracture is caused.

[Copper Foil Adhesive Strength]

In the metal-clad laminated board, the peeling strength of the copper foil from the insulating layer (copper foil adhesive strength: the peeling strength of the metal layer) was measured in accordance with JIS C 6481. A pattern of 10 mm in width and of 100 mm in length was formed, and peeled off at a speed of 50 mm/min with a tensile tester, and the peel strength (copper foil adhesive strength) at that time was measured. The unit of measurement is N/mm. It is to be noted that when this copper foil adhesive strength was higher than 0.5 N/mm, a cohesive failure was caused, whereas when this copper foil adhesive strength was 0.5 N/mm or less, an interfacial fracture was caused.

[Copper Foil Adhesive Strength after Acid Treatment]

The acid treatment of immersing the metal-clad laminated board in 12% hydrochloric acid for 30 minutes was carried out. The peeling strength of the copper foil from the insulating layer (copper foil adhesive strength) in the metal-clad laminated board after the acid treatment was measured by the method similar to the previously mentioned method for measuring copper foil adhesive strength. The copper foil adhesive strength thus obtained was regarded as the peeling strength of the metal layer in the metal-clad laminated board after the acid treatment (the peeling strength after the acid treatment). Further, the copper foil adhesive strength obtained by the method for measuring copper foil adhesive strength was regarded as the peeling strength of the metal layer in the metal-clad laminated board before the acid treatment (the peeling strength before the acid treatment). From these peeling strength results, the deterioration ratio of the peeling strength due to the acid treatment was calculated. The deterioration ratio of the peeling strength due to the acid treatment refers to the deterioration ratio of the peeling strength after the acid treatment to the peeling strength before the acid treatment, and the deterioration ratio was calculated from the following formula.

(Peeling Strength before Acid Treatment−Peeling Strength after Acid Treatment)/Peeling Strength before Acid Treatment×100

[Copper Foil Adhesive Strength after Moisture Absorption Treatment]

The moisture absorption treatment of immersing the metal-clad laminated board in water at 100° C. for 2 hours was carried out. The peeling strength of the copper foil from the insulating layer (copper foil adhesive strength) in the metal-clad laminated board after the moisture absorption treatment was measured by the method similar to the previously mentioned method for measuring copper foil adhesive strength. The copper foil adhesive strength thus obtained was regarded as the peeling strength of the metal layer in the metal-clad laminated board after the moisture absorption treatment (the peeling strength after the moisture absorption treatment). Further, the copper foil adhesive strength obtained by the method for measuring copper foil adhesive strength was regarded as the peeling strength of the metal layer in the metal-clad laminated hoard before the moisture absorption treatment (the peeling strength before the moisture absorption treatment). From these peeling strength results, the deterioration ratio of the peeling strength due to the moisture absorption treatment was calculated. The deterioration ratio of the peeling strength due to the moisture absorption treatment refers to the deterioration ratio of the peeling strength after the moisture absorption treatment to the peeling strength before the moisture absorption treatment, and the deterioration ratio was calculated from the following formula.

(Peeling Strength before Moisture Absorption Treatment−Peeling Strength after Moisture Absorption Treatment)/Peeling Strength before Moisture Absorption Treatment×100

[Oven Heat Resistance]

In accordance with the standard of JIS C 6481, the metal-clad laminated board was left in a thermostatic bath set at a predetermined temperature for 1 hour, and then taken out. Then, the metal-clad laminated board taken out was observed visually. If the occurrence of an abnormality such as swelling was not confirmed even when the temperature was 300° C., the metal-clad laminated board was evaluated as "very good". Further, if the occurrence of an abnormality such as swelling was confirmed when the temperature was 300° C., but the occurrence of an abnormality such as swelling was not confirmed when the temperature was 280° C., the metal-clad laminated board was evaluated as "good". Further, if the occurrence of an abnormality such as swelling was confirmed when the temperature was 280° C., but the occurrence of an abnormality such as swelling was not confirmed when the temperature was 260° C., the metal-clad laminated board was evaluated as "fair". Moreover, if the occurrence of an abnormality such as swelling was confirmed even when the temperature was 260° C., the metal-clad laminated board was evaluated as "poor".

[Solder Heat Resistance]

In the preparation of the metal-clad laminated board, the number of prepregs stacked was set to six, thereby providing a copper foil-clad laminated hoard (metal foil-clad laminated hoard) of about 0.8 mm in thickness with the copper foil adhesively attached to both sides. A grid-like pattern was formed in the copper foil on each side of the copper foil-clad laminated hoard such that the percentage of remaining copper was 50%, thereby forming wirings. One of the prepregs was laminated on each side of the board with the wirings formed, and heated and pressurized under the same conditions as in the case of manufacturing the copper foil-clad laminated board. The copper foil on both sides of the laminated body formed was removed by etching. The laminated body for evaluation thus obtained was immersed in water at 100° C. for 2 hours. Thereafter, the laminated body for evaluation immersed in water was immersed in a solder bath at 260° C. for 20 seconds. Then, the immersed laminated body was observed visually for the occurrence of measling, swelling, or the like. The laminated body was evaluated as "good" if it was not possible to confirm the occurrence of the measling, swelling, or the like, or evaluated as "poor" if it was possible to confirm the occurrence. In addition, separately, the same evaluation was performed with the use of a solder bath at 288° C. instead of the solder bath at 260° C.

[Dielectric Properties (Relative Dielectric Constant and Dielectric Loss Tangent)]

The relative dielectric constant and dielectric loss tangent of the evaluation board at 1 GHz were measured by a method in accordance with IPC-TM 650-2.5.5.9. Specifically, the relative dielectric constant and dielectric loss tangent of the evaluation board at 1 GHz were measured with the use of an impedance analyzer (RF impedance analyzer HP4291B manufactured by Agilent Technologies, Inc.).

The results in the respective evaluations mentioned above are shown in Tables 1 to 3. It is to be noted that in Tables 1 to 3, the term "Amount of First Silane Coupling Agent in Resin Composition" refers to the additive amount of the first silane coupling agent added to the resin composition, with respect to 100 parts by mass of the filler (the total of the silica particles surface-treated with the first silane coupling agent and the silica particles surface-treated with no first silane coupling agent). In addition, the term "Amount of First Silane Coupling Agent in Filler" refers to the amount of the first silane coupling contained in the filler (the silica particles surface-treated with the first silane coupling agent). Further, the term "total amount" refers to the amount of the first silane coupling contained in the filler, and the term "with respect to 100 parts by mass of filler" refers to the amount of the first silane coupling contained in the filler, with respect to the filler (the silica particles surface-treated with the first silane coupling agent).

In addition, the amount of the first silane coupling contained in the filler was calculated from weight loss measurement with a simultaneous thermogravimetric analyzer. Specifically, with the use of a simultaneous thermogravimetric analyzer (TG/DTA 7300 manufactured by Hitachi High-Tech Science Corporation), the amount of weight loss in the case of increasing the temperature from room temperature to 600° C. at 10° C./min, and then keeping the temperature at 600° C. for 1 hour under a nitrogen flow rate of 200 ml/min was regarded as the amount of the silane coupling agent contained in the filler.

In addition, the "Total Amount of First Silane Coupling Agent" refers to the total amount of the "Amount of First Silane Coupling Agent in Resin Composition" and "Amount of First Silane Coupling Agent in Filler (with respect to 100 parts by mass of filler).

TABLE 1

| | | | EXAMPLE | | | |
|---|---|---|---|---|---|---|
| | | | 1 | 2 | 3 | 4 |
| RESIN COMPOSITION (PARTS BY MASS) | PPE | MODIFIED PPE-1 | — | 70 | 70 | 70 |
| | | MODIFIED PPE-2 | 70 | — | — | — |
| | CURING AGENT | TAIC | 30 | 30 | 30 | 30 |
| | | DVB | — | — | — | — |
| | FIRST SILANE COUPLING AGENT | METHACRYLOXY GROUP | 2 | 2 | 2 | — |
| | | STYRYL GROUP | — | — | — | 2 |
| | | VINYL GROUP | — | — | — | — |
| | | ACRYLOXY GROUP | — | — | — | — |
| | AMOUNT OF FIRST SILANE COUPLING AGENT IN RESIN COMPOSITION (PARTS BY MASS WITH RESPECT TO 100 PARTS BY MASS OF FILLER) | | 1.0 | 1.0 | 1.0 | 1.0 |
| | REACTION INITIATOR | PEROXIDE | 2 | 2 | 2 | 2 |
| | FILLER | SILICA-1 | 200 | 200 | 200 | 200 |
| | | SILICA-2 | — | — | — | — |
| | AMOUNT OF FIRST SILANE COUPLING AGENT IN FILLER (PARTS BY MASS) | TOTAL AMOUNT | 1.0 | 1.0 | 1.0 | 1.0 |
| | | WITH RESPECT TO 100 PARTS BY MASS OF FILLER | 0.5 | 0.5 | 0.5 | 0.5 |
| | FLAME RETARDANT | PHOSPHINATE COMPOUND | — | — | 15 | — |
| | | PHOSPHAZENE COMPOUND | — | — | 2 | — |
| | | BROMINE-BASED COMPOUND | 15 | 15 | — | 15 |
| | TOTAL AMOUNT OF FIRST SILANE COUPLING AGENT (PARTS BY MASS WITH RESPECT TO 100 PARTS BY MASS OF FILLER) | | 1.5 | 1.5 | 1.5 | — |
| METAL LAYER | COPPER FOIL-1 | AMINOSILANE TREATMENT | PRESENT | PRESENT | PRESENT | PRESENT |
| | COPPER FOIL-3 | EPOXYSILANE TREATMENT | — | — | — | — |
| | COPPER FOIL-4 | STYRYLSILANE TREATMENT | — | — | — | — |
| | COPPER FOIL-5 | VINYLSILANE TREATMENT | — | — | — | — |
| EVALUATION | THERMAL CONDUCTIVITY (W/m · K) | | 0.6 | 0.6 | 0.6 | 0.6 |
| | INTERLAYER ADHESIVE STRENGTH (N/mm) | | 0.8 | 0.9 | 0.8 | 0.8 |
| | COPPER FOIL ADHESIVE STRENGTH (N/mm) | | 0.9 | 1.0 | 0.9 | 0.9 |
| | ACID TREATMENT | COPPER FOIL ADHESIVE STRENGTH(N/mm) | 0.89 | 0.98 | 0.88 | 0.88 |
| | | DETERIORATION RATIO (%) | 1.1 | 2.0 | 2.2 | 2.2 |
| | MOISTURE ABSORPTION TREATMENT | COPPER FOIL ADHESIVE STRENGTH(N/mm) | 0.86 | 0.96 | 0.85 | 0.85 |
| | | DETERIORATION RATIO (%) | 4.4 | 4.0 | 5.6 | 5.6 |
| | OVEN HEAT RESISTANCE | | VERY GOOD | VERY GOOD | VERY GOOD | VERY GOOD |
| | SOLDER HEAT RESISTANCE | 260° C. | GOOD | GOOD | GOOD | GOOD |
| | | 288° C. | GOOD | GOOD | GOOD | GOOD |
| | RELATIVE DIELECTRIC CONSTANT | | 3.6 | 3.6 | 3.7 | 3.7 |
| | DIELECTRIC LOSS TANGENT | | 0.002 | 0.002 | 0.002 | 0.002 |

TABLE 1-continued

| | | | EXAMPLE | | | |
|---|---|---|---|---|---|---|
| | | | 5 | 6 | 7 | 8 |
| RESIN COMPOSITION (PARTS BY MASS) | PPE | MODIFIED PPE-1 | 70 | 70 | 70 | 70 |
| | | MODIFIED PPE-2 | — | — | — | — |
| | CURING AGENT | TAIC | 30 | 30 | — | 30 |
| | | DVB | — | — | 30 | — |
| | FIRST SILANE COUPLING AGENT | METHACRYLOXY GROUP | — | — | 2 | — |
| | | STYRYL GROUP | — | — | — | — |
| | | VINYL GROUP | 2 | — | — | — |
| | | ACRYLOXY GROUP | — | 2 | — | — |
| | AMOUNT OF FIRST SILANE COUPLING AGENT IN RESIN COMPOSITION (PARTS BY MASS WITH RESPECT TO 100 PARTS BY MASS OF FILLER) | | 1.0 | 1.0 | 1.0 | 0 |
| | REACTION INITIATOR | PEROXIDE | 2 | 2 | 2 | 2 |
| | FILLER | SILICA-1 | 200 | 200 | 200 | 80 |
| | | SILICA-2 | — | — | — | — |
| | AMOUNT OF FIRST SILANE COUPLING AGENT IN FILLER (PARTS BY MASS) | TOTAL AMOUNT | 1.0 | 1.0 | 1.0 | 0.4 |
| | | WITH RESPECT TO 100 PARTS BY MASS OF FILLER | 0.5 | 0.5 | 0.5 | 0.5 |
| | FLAME RETARDANT | PHOSPHINATE COMPOUND | — | — | — | — |
| | | PHOSPHAZENE COMPOUND | — | — | — | — |
| | | BROMINE-BASED COMPOUND | 15 | 15 | 15 | 15 |
| | TOTAL AMOUNT OF FIRST SILANE COUPLING AGENT (PARTS BY MASS WITH RESPECT TO 100 PARTS BY MASS OF FILLER) | | 1.5 | 1.5 | 1.5 | 0.5 |
| METAL LAYER | COPPER FOIL-1 | AMINOSILANE TREATMENT | PRESENT | PRESENT | PRESENT | PRESENT |
| | COPPER FOIL-3 | EPOXYSILANE TREATMENT | — | — | — | — |
| | COPPER FOIL-4 | STYRYLSILANE TREATMENT | — | — | — | — |
| | COPPER FOIL-5 | VINYLSILANE TREATMENT | — | — | — | — |
| EVALUATION | THERMAL CONDUCTIVITY (W/m · K) | | 0.6 | 0.6 | 0.6 | 0.3 |
| | INTERLAYER ADHESIVE STRENGTH (N/mm) | | 0.8 | 0.8 | 0.8 | 0.8 |
| | COPPER FOIL ADHESIVE STRENGTH (N/mm) | | 0.9 | 0.9 | 1.0 | 0.6 |
| | ACID TREATMENT | COPPER FOIL ADHESIVE STRENGTH(N/mm) | 0.88 | 0.87 | 0.97 | 0.57 |
| | | DETERIORATION RATIO (%) | 2.2 | 3.3 | 3.0 | 5.0 |
| | MOISTURE ABSORPTION TREATMENT | COPPER FOIL ADHESIVE STRENGTH(N/mm) | 0.85 | 0.84 | 0.95 | 0.57 |
| | | DETERIORATION RATIO (%) | 5.6 | 6.7 | 5.0 | 5.0 |
| | OVEN HEAT RESISTANCE | | VERY GOOD | VERY GOOD | VERY GOOD | VERY GOOD |
| | SOLDER HEAT RESISTANCE | 260° C. | GOOD | GOOD | GOOD | GOOD |
| | | 288° C. | GOOD | GOOD | GOOD | GOOD |
| | RELATIVE DIELECTRIC CONSTANT | | 3.7 | 3.7 | 3.6 | 3.6 |
| | DIELECTRIC LOSS TANGENT | | 0.002 | 0.002 | 0.002 | 0.002 |

| | | | COMPARATIVE EXAMPLE | | | |
|---|---|---|---|---|---|---|
| | | | 1 | 2 | 3 | 4 |
| RESIN COMPOSITION (PARTS BY MASS) | PPE | MODIFIED PPE-1 | 70 | 70 | 70 | 70 |
| | | MODIFIED PPE-2 | — | — | — | — |
| | CURING AGENT | TAIC | 30 | 30 | 30 | 30 |
| | | DVB | — | — | — | — |
| | FIRST SILANE COUPLING AGENT | METHACRYLOXY GROUP | 2 | 1.2 | 1.2 | — |
| | | STYRYL GROUP | — | — | — | — |
| | | VINYL GROUP | — | — | — | — |
| | | ACRYLOXY GROUP | — | — | — | — |
| | AMOUNT OF FIRST SILANE COUPLING AGENT IN RESIN COMPOSITION (PARTS BY MASS WITH RESPECT TO 100 PARTS BY MASS OF FILLER) | | 1.0 | 1.0 | 1.0 | 0 |
| | REACTION INITIATOR | PEROXIDE | 2 | 2 | 2 | 2 |
| | FILLER | SILICA-1 | 200 | 120 | 120 | — |
| | | SILICA-2 | — | — | — | 200 |
| | AMOUNT OF FIRST SILANE COUPLING AGENT IN FILLER (PARTS BY MASS) | TOTAL AMOUNT | 1.0 | 0.6 | 0.6 | 0 |
| | | WITH RESPECT TO 100 PARTS BY MASS OF FILLER | 0.5 | 0.5 | 0.5 | 0 |
| | FLAME RETARDANT | PHOSPHINATE COMPOUND | — | — | — | — |
| | | PHOSPHAZENE COMPOUND | — | — | — | — |
| | | BROMINE-BASED COMPOUND | 15 | 15 | 15 | 15 |

TABLE 1-continued

|  |  |  |  |  |  |  |
|---|---|---|---|---|---|---|
|  | TOTAL AMOUNT OF FIRST SILANE COUPLING AGENT (PARTS BY MASS WITH RESPECT TO 100 PARTS BY MASS OF FILLER) |  | 1.5 | 1.5 | 1.5 | 0 |
| METAL LAYER | COPPER FOIL-1 | AMINOSILANE TREATMENT | — | — | — | PRESENT |
|  | COPPER FOIL-3 | EPOXYSILANE TREATMENT | PRESENT | — | — | — |
|  | COPPER FOIL-4 | STYRYLSILANE TREATMENT | — | PRESENT | — | — |
|  | COPPER FOIL-5 | VINYLSILANE TREATMENT | — | — | PRESENT | — |
| EVALUATION | THERMAL CONDUCTIVITY (W/m · K) |  | 0.6 | 0.5 | 0.5 | 0.6 |
|  | INTERLAYER ADHESIVE STRENGTH (N/mm) |  | 0.8 | 0.9 | 0.9 | 0.4 |
|  | COPPER FOIL ADHESIVE STRENGTH (N/mm) |  | 0.3 | 0.3 | 0.3 | 0.4 |
|  | ACID TREATMENT | COPPER FOIL ADHESIVE STRENGTH(N/mm) | 0.22 | 0.25 | 0.25 | 0.33 |
|  |  | DETERIORATION RATIO (%) | 26.7 | 16.7 | 16.7 | 17.5 |
|  | MOISTURE ABSORPTION TREATMENT | COPPER FOIL ADHESIVE STRENGTH(N/mm) | 0.23 | 0.26 | 0.26 | 0.34 |
|  |  | DETERIORATION RATIO (%) | 23.3 | 13.3 | 13.3 | 15.0 |
|  | OVEN HEAT RESISTANCE |  | POOR | POOR | POOR | FAIR |
|  | SOLDER HEAT RESISTANCE | 260° C. | POOR | POOR | POOR | GOOD |
|  |  | 288° C. | POOR | POOR | POOR | POOR |
|  | RELATIVE DIELECTRIC CONSTANT |  | 3.8 | 3.6 | 3.6 | 3.8 |
|  | DIELECTRIC LOSS TANGENT |  | 0.002 | 0.002 | 0.002 | 0.002 |

TABLE 2

|  |  |  | EXAMPLE | | | |
|---|---|---|---|---|---|---|
|  |  |  | 9 | 10 | 11 | 12 |
| RESIN COMPOSITION (PARTS BY MASS) | PPE | MODIFIED PPE-1 | 70 | 70 | 70 | 70 |
|  | CURING AGENT | TAIC | 30 | 30 | 30 | 30 |
|  | FIRST SILANE COUPLING AGENT | METHACRYLOXY GROUP | 1.2 | 0.4 | 0.8 | 1.2 |
|  | AMOUNT OF FIRST SILANE COUPLING AGENT IN RESIN COMPOSITION (PARTS BY MASS WITH RESPECT TO 100 PARTS BY MASS OF FILLER) |  | 1.0 | 1.0 | 1.0 | 1.0 |
|  | REACTION INITIATOR | PEROXIDE | 2 | 2 | 2 | 2 |
|  | FILLER | SILICA-1 | 120 | 40 | 80 | 120 |
|  | AMOUNT OF FIRST SILANE COUPLING AGENT IN FILLER (PARTS BY MASS) | TOTAL AMOUNT WITH RESPECT TO 100 PARTS BY MASS OF FILLER | 0.6 0.5 | 0.2 0.5 | 0.4 0.5 | 0.6 0.5 |
|  | FLAME RETARDANT | BROMINE-BASED COMPOUND | 20 | 20 | 15 | 20 |
|  | DISPERSANT |  | — | — | — | — |
|  | TOTAL AMOUNT OF FIRST SILANE COUPLING AGENT (PARTS BY MASS WITH RESPECT TO 100 PARTS BY MASS OF FILLER) |  | 1.5 | 1.5 | 1.5 | 1.5 |
| METAL LAYER | COPPER FOIL-1 | AMINOSILANE TREATMENT | PRESENT | PRESENT | PRESENT | — |
|  | COPPER FOIL-2 | AMINOSILANE TREATMENT | — | — | — | PRESENT |
| EVALUATION | THERMAL CONDUCTIVITY (W/m · K) |  | 0.5 | 0.3 | 0.3 | 0.5 |
|  | INTERLAYER ADHESIVE STRENGTH (N/mm) |  | 0.9 | 1.1 | 1.0 | 0.9 |
|  | COPPER FOIL ADHESIVE STRENGTH(N/mm) |  | 1.1 | 1.0 | 1.1 | 0.7 |
|  | ACID TREATMENT | COPPER FOIL ADHESIVE STRENGTH(N/mm) | 1.06 | 0.94 | 1.04 | 0.67 |
|  |  | DETERIORATION RATIO (%) | 3.6 | 6.0 | 5.5 | 4.3 |
|  | MOISTURE ABSORPTION TREATMENT | COPPER FOIL ADHESIVE STRENGTH(N/mm) | 1.04 | 0.92 | 1.02 | 0.66 |
|  |  | DETERIORATION RATIO (%) | 5.5 | 8.0 | 7.3 | 5.7 |
|  | OVEN HEAT RESISTANCE |  | VERY GOOD | VERY GOOD | VERY GOOD | GOOD |
|  | SOLDER HEAT RESISTANCE | 260° C. | GOOD | GOOD | GOOD | GOOD |
|  |  | 288° C. | GOOD | GOOD | GOOD | GOOD |
|  | RELATIVE DIELECTRIC CONSTANT |  | 3.6 | 3.4 | 3.5 | 3.6 |
|  | DIELECTRIC LOSS TANGENT |  | 0.002 | 0.003 | 0.003 | 0.002 |

|  |  |  | EXAMPLE | | | |
|---|---|---|---|---|---|---|
|  |  |  | 13 | 14 | 15 | 16 |
| RESIN COMPOSITION (PARTS BY MASS) | PPE | MODIFIED PPE-1 | 70 | 70 | 70 | 70 |
|  | CURING AGENT | TAIC | 30 | 30 | 30 | 30 |
|  | FIRST SILANE COUPLING AGENT | METHACRYLOXY GROUP | 2.5 | 1 | 4 | 8 |
|  | AMOUNT OF FIRST SILANE COUPLING AGENT IN RESIN COMPOSITION (PARTS BY MASS WITH RESPECT TO 100 PARTS BY MASS OF FILLER) |  | 1.0 | 0.5 | 2.0 | 4.0 |

TABLE 2-continued

|  |  |  |  |  |  |  |  |
|---|---|---|---|---|---|---|---|
|  |  | REACTION INITIATOR | PEROXIDE | 2 | 2 | 2 | 2 |
|  |  | FILLER | SILICA-1 | 250 | 200 | 200 | 200 |
|  |  | AMOUNT OF FIRST SILANE COUPLING AGENT IN FILLER (PARTS BY MASS) | TOTAL AMOUNT | 1.3 | 1.0 | 1.0 | 1.0 |
|  |  |  | WITH RESPECT TO 100 PARTS BY MASS OF FILLER | 0.5 | 0.5 | 0.5 | 0.5 |
|  |  | FLAME RETARDANT | BROMINE-BASED COMPOUND | 13 | 15 | 15 | 15 |
|  |  | DISPERSANT |  | 2.5 | — | — | — |
|  |  | TOTAL AMOUNT OF FIRST SILANE COUPLING AGENT (PARTS BY MASS WITH RESPECT TO 100 PARTS BY MASS OF FILLER) |  | 1.5 | 1 | 2.5 | 4.5 |
| METAL LAYER EVALUATION | COPPER FOIL-1 | AMINOSILANE TREATMENT |  | PRESENT | PRESENT | PRESENT | PRESENT |
|  | COPPER FOIL-2 | AMINOSILANE TREATMENT |  | — | — | — | — |
|  | THERMAL CONDUCTIVITY (W/m · K) |  |  | 0.7 | 0.6 | 0.6 | 6.6 |
|  | INTERLAYER ADHESIVE STRENGTH (N/mm) |  |  | 0.6 | 0.7 | 0.9 | 1.0 |
|  | COPPER FOIL ADHESIVE STRENGTH (N/mm) |  |  | 0.8 | 0.8 | 1.0 | 1.1 |
|  | ACID TREATMENT | COPPER FOIL ADHESIVE STRENGTH (N/mm) |  | 0.77 | 0.77 | 0.98 | 1.08 |
|  |  | DETERIORATION RATIO (%) |  | 3.8 | 3.8 | 2.0 | 2.7 |
|  | MOISTURE ABSORPTION TREATMENT | COPPER FOIL ADHESIVE STRENGTH (N/mm) |  | 0.76 | 0.76 | 0.95 | 1.07 |
|  |  | DETERIORATION RATIO (%) |  | 5.0 | 5.0 | 5.0 | 3.6 |
|  | OVEN HEAT RESISTANCE |  |  | VERY GOOD | VERY GOOD | VERY GOOD | VERY GOOD |
|  | SOLDER HEAT RESISTANCE | 260° C. |  | GOOD | GOOD | GOOD | GOOD |
|  |  | 288° C. |  | GOOD | GOOD | GOOD | GOOD |
|  | RELATIVE DIELECTRIC CONSTANT |  |  | 3.8 | 3.7 | 3.8 | 3.8 |
|  | DIELECTRIC LOSS TANGENT |  |  | 0.002 | 0.002 | 0.002 | 0.003 |

|  |  |  |  | COMPARATIVE EXAMPLE | | |
|---|---|---|---|---|---|---|
|  |  |  |  | 5 | 6 | 7 |
| RESIN COMPOSITION (PARTS BY MASS) | PPE | MODIFIED PPE-1 |  | 70 | 70 | 70 |
|  | CURING AGENT | TAIC |  | 30 | 30 | 30 |
|  | FIRST SILANE COUPLING AGENT | METHACRYLOXY GROUP |  | 14 | 6 | 0.6 |
|  | AMOUNT OF FIRST SILANE COUPLING AGENT IN RESIN COMPOSITION (PARTS BY MASS WITH RESPECT TO 100 PARTS BY MASS OF FILLER) |  |  | 7.0 | 2.0 | 2.0 |
|  | REACTION INITIATOR | PEROXIDE |  | 2 | 2 | 2 |
|  | FILLER | SILICA-1 |  | 200 | 300 | 30 |
|  | AMOUNT OF FIRST SILANE COUPLING AGENT IN FILLER (PARTS BY MASS) | TOTAL AMOUNT |  | 1.0 | 1.5 | 0.2 |
|  |  | WITH RESPECT TO 100 PARTS BY MASS OF FILLER |  | 0.5 | 0.5 | 0.5 |
|  | FLAME RETARDANT | BROMINE-BASED COMPOUND |  | 15 | 13 | 30 |
|  | DISPERSANT |  |  | — | 6 | 1 |
|  | TOTAL AMOUNT OF FIRST SILANE COUPLING AGENT (PARTS BY MASS WITH RESPECT TO 100 PARTS BY MASS OF FILLER) |  |  | 7.5 | 2.5 | 2.5 |
| METAL LAYER EVALUATION | COPPER FOIL-1 | AMINOSILANE TREATMENT |  | PRESENT | PRESENT | PRESENT |
|  | COPPER FOIL-2 | AMINOSILANE TREATMENT |  | — | — | — |
|  | THERMAL CONDUCTIVITY (W/m · K) |  |  | 0.6 | 0.7 | 0.3 |
|  | INTERLAYER ADHESIVE STRENGTH (N/mm) |  |  | 1.1 | 0.4 | 1.1 |
|  | COPPER FOIL ADHESIVE STRENGTH (N/mm) |  |  | 1.2 | 0.7 | 1.0 |
|  | ACID TREATMENT | COPPER FOIL ADHESIVE STRENGTH (N/mm) |  | 1.16 | 0.68 | 0.93 |
|  |  | DETERIORATION RATIO (%) |  | 3.3 | 2.9 | 7.0 |
|  | MOISTURE ABSORPTION TREATMENT | COPPER FOIL ADHESIVE STRENGTH (N/mm) |  | 1.11 | 0.67 | 0.92 |
|  |  | DETERIORATION RATIO (%) |  | 7.5 | 5.7 | 8.0 |
|  | OVEN HEAT RESISTANCE |  |  | POOR | FAIR | GOOD |
|  | SOLDER HEAT RESISTANCE | 260° C. |  | POOR | GOOD | GOOD |
|  |  | 288° C. |  | POOR | POOR | GOOD |
|  | RELATIVE DIELECTRIC CONSTANT |  |  | 3.9 | 4.0 | 3.4 |
|  | DIELECTRIC LOSS TANGENT |  |  | 0.004 | 0.004 | 0.004 |

|  |  |  | EXAMPLE | | | | |
|---|---|---|---|---|---|---|---|
|  |  |  | 17 | 18 | 19 | 20 | 21 |
| RESIN COMPOSITION (PARTS BY MASS) | PPE | MODIFIED PPE-1 | 70 | 70 | 70 | 70 | 70 |
|  | CURING AGENT | TAIC | 30 | 30 | 30 | 30 | 30 |
|  | FIRST SILANE COUPLING AGENT | METHACRYLOXY GROUP | 4 | 8 | 0.4 | — | 1.2 |
|  |  | STYRYL GROUP | — | — | — | — | — |
|  |  | VINYL GROUP | — | — | — | 1 | — |
|  |  | ACRYLOXY GROUP | — | — | — | — | — |

-continued

|  |  |  |  |  |  |  |  |
|---|---|---|---|---|---|---|---|
|  |  | GLYCIDOXY GROUP | — | — | — | — | — |
|  |  | AMINO GROUP | — | — | — | — | — |
|  |  | AMOUNT OF FIRST SILANE COUPLING AGENT IN RESIN COMPOSITION (PARTS BY MASS WITH RESPECT TO 100 PARTS BY MASS OF FILLER) | 2.0 | 4.0 | 0.2 | 0.5 | 0.6 |
|  |  | REACTION INITIATOR     PEROXIDE | 2 | 2 | 2 | 2 | 2 |
|  |  | SILICA-2 | 200 | 200 | 200 | 200 | 200 |
|  |  | SILICA-3 | — | — | — | — | — |
|  |  | BROMINE-BASED COMPOUND | 15 | 15 | 15 | 15 | 20 |
|  |  | DISPERSANT | — | — | — | — | — |
|  |  | TOTAL AMOUNT OF FIRST SILANE COUPLING AGENT (PARTS BY MASS WITH RESPECT TO 100 PARTS BY MASS OF FILLER) | 2.0 | 4.0 | 0.2 | 0.5 | 0.6 |
| METAL LAYER EVALUATION | COPPER FOIL-1 | AMINOSILANE TREATMENT | PRESENT | PRESENT | PRESENT | PRESENT | PRESENT |
|  | COPPER FOIL-2 | AMINOSILANE TREATMENT | — | — | — | — | — |
|  | THERMAL CONDUCTIVITY (W/m · K) |  | 0.6 | 0.6 | 0.6 | 0.6 | 0.6 |
|  | INTERLAYER ADHESIVE STRENGTH (N/mm) |  | 0.9 | 1.0 | 0.6 | 0.6 | 0.7 |
|  | COPPER FOIL ADHESIVE STRENGTH (N/mm) |  | 1.0 | 1.1 | 0.8 | 0.8 | 1.0 |
|  | ACID TREATMENT | COPPER FOIL ADHESIVE STRENGTH(N/mm) | 0.98 | 1.08 | 0.77 | 0.78 | 0.95 |
|  |  | DETERIORATION RATIO (%) | 2.0 | 2.7 | 3.8 | 2.5 | 5.0 |
|  | MOISTURE ABSORPTION TREATMENT | COPPER FOIL ADHESIVE STRENGTH(N/mm) | 0.95 | 1.07 | 0.73 | 0.75 | 0.94 |
|  |  | DETERIORATION RATIO (%) | 5.0 | 3.6 | 8.8 | 6.3 | 6.0 |
|  | OVEN HEAT RESISTANCE |  | VERY GOOD | VERY GOOD | GOOD | GOOD | VERY GOOD |
|  | SOLDER HEAT RESISTANCE | 260° C. | GOOD | GOOD | GOOD | GOOD | GOOD |
|  |  | 288° C. | GOOD | GOOD | GOOD | GOOD | GOOD |
|  | RELATIVE DIELECTRIC CONSTANT |  | 3.8 | 3.8 | 3.8 | 3.8 | 3.8 |
|  | DIELECTRIC LOSS TANGENT |  | 0.002 | 0.003 | 0.002 | 0.002 | 0.002 |

|  |  |  | EXAMPLE |  |  |  |  |  |
|---|---|---|---|---|---|---|---|---|
|  |  |  | 22 | 23 | 24 | 25 | 26 | 27 |
| RESIN COMPOSITION (PARTS BY MASS) | PPE | MODIFIED PPE-1 | 70 | 70 | 70 | 70 | 70 | 70 |
|  | CURING AGENT | TAIC | 30 | 30 | 30 | 30 | 30 | 30 |
|  | FIRST SILANE COUPLING AGENT | METHACRYLOXY GROUP | 2 | — | — | — | — | 4 |
|  |  | STYRYL GROUP | — | 2 | — | — | — | — |
|  |  | VINYL GROUP | — | — | 2 | — | — | — |
|  |  | ACRYLOXY GROUP | — | — | — | 2 | 2 | — |
|  |  | GLYCIDOXY GROUP | — | — | — | — | — | — |
|  |  | AMINO GROUP | — | — | — | — | — | — |
|  | AMOUNT OF FIRST SILANE COUPLING AGENT IN RESIN COMPOSITION (PARTS BY MASS WITH RESPECT TO 100 PARTS BY MASS OF FILLER) |  | 1.0 | 1.0 | 1.0 | 1.0 | 1.0 | 2.0 |
|  | REACTION INITIATOR     PEROXIDE |  | 2 | 2 | 2 | 2 | 2 | 2 |
|  | SILICA-2 |  | 200 | 200 | 200 | 200 | 200 | — |
|  | SILICA-3 |  | — | — | — | — | — | 200 |
|  | BROMINE-BASED COMPOUND |  | 15 | 15 | 15 | 15 | 15 | 15 |
|  | DISPERSANT |  | — | — | — | — | — | 2 |
|  | TOTAL AMOUNT OF FIRST SILANE COUPLING AGENT (PARTS BY MASS WITH RESPECT TO 100 PARTS BY MASS OF FILLER) |  | 1.0 | 1.0 | 1.0 | 1.0 | 1.0 | 2.0 |
| METAL LAYER EVALUATION | COPPER FOIL-1 | AMINOSILANE TREATMENT | PRESENT | PRESENT | PRESENT | PRESENT | — | PRESENT |
|  | COPPER FOIL-2 | AMINOSILANE TREATMENT | — | — | — | — | — | — |
|  | THERMAL CONDUCTIVITY (W/m · K) |  | 0.6 | 0.6 | 0.6 | 0.6 | 0.6 | 0.6 |
|  | INTERLAYER ADHESIVE STRENGTH (N/mm) |  | 0.6 | 0.6 | 0.6 | 0.6 | 0.6 | 0.7 |
|  | COPPER FOIL ADHESIVE STRENGTH (N/mm) |  | 1.0 | 1.0 | 1.0 | 1.0 | 0.6 | 1.0 |
|  | ACID TREATMENT | COPPER FOIL ADHESIVE STRENGTH(N/mm) | 0.97 | 0.97 | 0.97 | 0.97 | 0.58 | 0.98 |
|  |  | DETERIORATION RATIO (%) | 3.0 | 3.0 | 3.0 | 3.0 | 3.3 | 2.0 |
|  | MOISTURE ABSORPTION TREATMENT | COPPER FOIL ADHESIVE STRENGTH(N/mm) | 0.96 | 0.96 | 0.96 | 0.96 | 0.56 | 0.95 |
|  |  | DETERIORATION RATIO (%) | 4.0 | 4.0 | 4.0 | 4.0 | 6.6 | 5.0 |
|  | OVEN HEAT RESISTANCE |  | VERY GOOD | VERY GOOD | VERY GOOD | VERY GOOD | VERY GOOD | VERY GOOD |
|  | SOLDER HEAT RESISTANCE | 260° C. | GOOD | GOOD | GOOD | GOOD | GOOD | GOOD |
|  |  | 288° C. | GOOD | GOOD | GOOD | GOOD | GOOD | GOOD |
|  | RELATIVE DIELECTRIC CONSTANT |  | 3.8 | 3.8 | 3.8 | 3.8 | 3.8 | 3.8 |
|  | DIELECTRIC LOSS TANGENT |  | 0.002 | 0.002 | 0.002 | 0.002 | 0.002 | 0.002 |

-continued

|  |  |  |  | COMPARATIVE EXAMPLE | | | |
|---|---|---|---|---|---|---|---|
|  |  |  |  | 8 | 9 | 10 | 11 |
| RESIN COMPOSITION (PARTS BY MASS) | PPE | MODIFIED PPE-1 | | 70 | 70 | 70 | 70 |
|  | CURING AGENT | TAIC | | 30 | 30 | 30 | 30 |
|  | FIRST SILANE COUPLING AGENT | METHACRYLOXY GROUP | | — | — | 0.35 | — |
|  |  | STYRYL GROUP | | — | — | — | — |
|  |  | VINYL GROUP | | — | — | — | 0.35 |
|  |  | ACRYLOXY GROUP | | — | — | — | — |
|  |  | GLYCIDOXY GROUP | | 2 | — | — | — |
|  |  | AMINO GROUP | | — | 2 | — | — |
|  | AMOUNT OF FIRST SILANE COUPLING AGENT IN RESIN COMPOSITION (PARTS BY MASS WITH RESPECT TO 100 PARTS BY MASS OF FILLER) | | | 1.0 | 1.0 | 0.18 | 0.18 |
|  | REACTION INITIATOR | PEROXIDE | | 2 | 2 | 2 | 2 |
|  |  | SILICA-2 | | 200 | 200 | 200 | 200 |
|  |  | SILICA-3 | | — | — | — | — |
|  |  | BROMINE-BASED COMPOUND | | 15 | 15 | 15 | 15 |
|  | DISPERSANT | | | — | — | — | — |
|  | TOTAL AMOUNT OF FIRST SILANE COUPLING AGENT (PARTS BY MASS WITH RESPECT TO 100 PARTS BY MASS OF FILLER) | | | 1.0 | 1.0 | 0.18 | 0.18 |
| METAL LAYER EVALUATION | COPPER FOIL-1 | AMINOSILANE TREATMENT | | PRESENT | PRESENT | PRESENT | PRESENT |
|  | COPPER FOIL-2 | AMINOSILANE TREATMENT | | — | — | — | — |
|  | THERMAL CONDUCTIVITY (W/m · K) | | | 0.6 | 0.6 | 0.6 | 0.6 |
|  | INTERLAYER ADHESIVE STRENGTH (N/mm) | | | 0.4 | 0.4 | 0.4 | 0.4 |
|  | COPPER FOIL ADHESIVE STRENGTH (N/mm) | | | 0.4 | 0.4 | 0.3 | 0.3 |
|  | ACID TREATMENT | COPPER FOIL ADHESIVE STRENGTH (N/mm) | | 0.36 | 0.37 | 0.23 | 0.23 |
|  |  | DETERIORATION RATIO (%) | | 10 | 7.5 | 23.3 | 23.3 |
|  | MOISTURE ABSORPTION TREATMENT | COPPER FOIL ADHESIVE STRENGTH (N/mm) | | 0.35 | 0.35 | 0.25 | 0.25 |
|  |  | DETERIORATION RATIO (%) | | 12.5 | 12.5 | 16.7 | 10.7 |
|  | OVEN HEAT RESISTANCE | | | FAIR | FAIR | POOR | POOR |
|  | SOLDER HEAT RESISTANCE | 260° C. | | GOOD | GOOD | POOR | POOR |
|  |  | 288° C. | | POOR | POOR | POOR | POOR |
|  | RELATIVE DIELECTRIC CONSTANT | | | 3.8 | 3.8 | 3.8 | 3.8 |
|  | DIELECTRIC LOSS TANGENT | | | 0.002 | 0.002 | 0.002 | 0.002 |

As can be seen from Tables 1 to 3, the metal-clad laminated boards (Examples 1 to 27) where the metal layer surface-treated with the second silane coupling agent was joined to the insulating layer including the modified polyphenylene ether compound and the crosslinkable curing agent, and further including the cured product of the resin composition containing the first silane coupling agent and the silica particles in predetermined amounts were lower in relative dielectric constant and dielectric properties, higher in thermal conductivity, and more excellent in heat resistance, moisture resistance, and chemical resistance, as compared with the other cases (Comparative Examples 1 to 11).

Specifically, the metal-clad laminated boards according to Examples 1 to 27 were first higher in thermal conductivity and lower in relative dielectric constant and dielectric loss tangent. This is believed to be because the insulating layer includes the modified polyphenylene ether compound, and includes the cured product of the resin composition containing the silica particles in a relatively large amount. Furthermore, the metal-clad laminated hoards according to Examples 1 to 27 were, even with the high content of the silica particles, high in interlayer adhesive strength and copper foil adhesive strength, and also excellent in oven heat resistance and solder heat resistance. From the foregoing, it is found that the metal-clad laminated boards could sufficiently suppress the delamination which may be caused at the time of heating, and were thus excellent in heat resistance. Furthermore, the metal-clad laminated boards were high in copper foil adhesive strength, even after the acid treatment and after the moisture absorption treatment. From the foregoing, it was found that the metal-clad laminated boards were also excellent in moisture resistance and chemical resistance. These are believed to be because of the resin composition containing therein the first silane coupling agent, and further of the use of the copper foil surface-treated with the second silane coupling agent.

Furthermore, the metal-clad laminated boards according to Examples 1 to 27 were higher in copper foil adhesive strength, and also more excellent in oven heat resistance and solder heat resistance, as compared with the cases where the silane coupling agent other than the silane coupling agent having an amino group in the molecule was used as the second silane coupling agent (Comparative Examples 1 to 3). Furthermore, the metal-clad laminated boards were high in copper foil adhesive strength, even after the acid treatment and after the moisture absorption treatment.

Furthermore, the metal-clad laminated boards according to Examples 1 to 27 were higher in interlayer adhesive strength and copper foil adhesive strength, and also more excellent in oven heat resistance and solder heat resistance, as compared with the case where the first silane coupling agent was not used (Comparative Example 4). Furthermore, the metal-clad laminated boards were high in copper foil adhesive strength, even after the acid treatment and after the moisture absorption treatment.

Furthermore, the metal-clad laminated boards according to Examples 1 to 27 were more excellent in oven heat resistance and solder heat resistance, and also higher in dielectric constant and dielectric properties, as compared with the case where the content of the first silane coupling agent was greater than 5 parts by mass with respect to 100 parts by mass in total of the silica particles and the silica particles surface-treated with the first silane coupling agent (Comparative Example 5).

Furthermore, the metal-clad laminated board according to Examples 1 to 27 were lower in dielectric properties and high in thermal conductivity, as compared with the case where the content of the silica particles was lower (Comparative Example 7). Furthermore, the metal-clad laminated boards according to Examples 1 to 27 were lower in dielectric constant and dielectric properties, also higher in interlayer adhesive strength, and also more excellent in oven heat resistance and solder heat resistance, as compared with the case where the content of the silica particles was higher (Comparative Example 6).

Furthermore, the metal-clad laminated boards according to Examples 1 to 27 were higher in interlayer adhesive strength and copper foil adhesive strength, and also more excellent in oven heat resistance and solder heat resistance, as compared with the cases where the silane coupling agent other than the silane coupling agent having a carbon-carbon unsaturated double bond in the molecule was used as the first silane coupling agent (Comparative Examples 8 and 9). Furthermore, the metal-clad laminated boards were high in copper foil adhesive strength, even after the acid treatment and after the moisture absorption treatment.

Furthermore, the metal-clad laminated hoards according to Examples 1 to 27 were higher in interlayer adhesive strength and copper foil adhesive strength, and also more excellent in oven heat resistance and solder heat resistance, as compared with the cases where the silane coupling agent other than the silane coupling agent having a carbon-carbon unsaturated double bond in the molecule was used as the first silane coupling agent (Comparative Examples 10 and 11). Furthermore, the metal-clad laminated boards were high in copper foil adhesive strength, even after the acid treatment and after the moisture absorption treatment.

From the foregoing, it was found that when the metal layer surface-treated with the second silane coupling agent was joined to the insulating layer including the modified polyphenylene ether compound and the crosslinkable curing agent, and further including the cured product of the resin composition containing the first silane coupling agent and the silica particles in predetermined amounts, a metal-clad laminated board was obtained which was lower in dielectric constant and dielectric properties, higher in thermal conductivity, and excellent in heat resistance, moisture resistance, and chemical resistance.

This application is based on Japanese Patent Application No. 2017-076951 filed on Apr. 7, 2017 and Japanese Patent Application No. 2017-247453 filed on Dec. 25, 2017, the contents of which are incorporated in the present application.

Although the present invention has been described appropriately and sufficiently through the above-described embodiments in order to illustrate the present invention, it should be understood that one skilled in the art could easily modify and/or improve the previously described embodiments. Accordingly, unless a change or improvement made by one skilled in the art remains at a level that does not depart from the scope of the claims, the change or improvement is interpreted as being included in the scope of the claims.

INDUSTRIAL APPLICABILITY

The present invention provides a metal-clad laminated board, a metal member with resin, and a wiring board which are low in dielectric constant and dielectric properties, high in thermal conductivity, and excellent in heat resistance, moisture resistance, and chemical resistance.

The invention claimed is:

1. A metal-clad laminated board comprising an insulating layer and a metal layer present in contact with at least one surface of the insulating layer,
   wherein
   the insulating layer includes a cured product of a resin composition containing a modified polyphenylene ether compound terminally modified with a substituent having a carbon-carbon unsaturated double bond; a crosslinkable curing agent having a carbon-carbon unsaturated double bond in a molecule; a first silane coupling agent having a carbon-carbon unsaturated double bond in a molecule; and at least one of silica particles and silica particles surface-treated with the first silane coupling agent,
   a total content of the silica particles and the silica particles surface-treated with the first silane coupling agent is 40 to 250 parts by mass with respect to 100 parts by mass in total of the modified polyphenylene ether compound and the crosslinkable curing agent,
   a total content of the first silane coupling agent contained in the resin composition and the first silane coupling agent contained in the silica particles surface-treated with the first silane coupling agent is 0.2 to 5 parts by mass with respect to 100 parts by mass in total of the silica particles and the silica particles surface-treated with the first silane coupling agent, and
   a contact surface of the metal layer in contact with the insulating layer is surface-treated with a second silane coupling agent having an amino group in a molecule.

2. The metal-clad laminated board according to claim 1, wherein, a deterioration ratio of peeling strength of the metal layer in the metal-clad laminated board after an acid treatment to peeling strength of the metal layer in the metal-clad laminated board before the acid treatment is 7% or less.

3. The metal-clad laminated board according to claim 1, wherein a deterioration ratio of peeling strength of the metal layer in the metal-clad laminated board after a moisture absorption treatment to peeling strength of the metal layer in the metal-clad laminated board before the moisture absorption treatment is 10% or less.

4. The metal-clad laminated board according to claim 1, wherein the first silane coupling agent has at least one functional group selected from the group consisting of a methacryloxy group, a styryl group, a vinyl group, and an acryloxy group.

5. The metal-clad laminated board according to claim 1, wherein the resin composition further contains a dispersant.

6. The metal-clad laminated board according to claim 1, wherein
   the resin composition further contains a flame retardant, and
   the flame retardant is at least one of a bromine-based flame retardant and a phosphorus-based flame retardant.

7. The metal-clad laminated board according to claim 6, wherein the phosphorus-based flame retardant contains a compatible phosphorus compound that is compatible with a mixture of the modified polyphenylene ether compound and the crosslinkable curing agent, and an incompatible phosphorus compound that is not compatible with the mixture.

8. A metal member with resin, comprising a resin layer and a metal layer present in contact with at least one surface of the resin layer, wherein
the resin layer includes a resin composition containing a modified polyphenylene ether compound terminally modified with a substituent having a carbon-carbon unsaturated double bond; a crosslinkable curing agent having a carbon-carbon unsaturated double bond in a molecule; a first silane coupling agent having a carbon-carbon unsaturated double bond in a molecule; and at least one of silica particles and silica particles surface-treated with the first silane coupling agent, or a semi-cured product of the resin composition, a total content of the silica particles and the silica particles surface-treated with the first silane coupling agent is 40 to 250 parts by mass with respect to 100 parts by mass in total of the modified polyphenylene ether compound and the crosslinkable curing agent, a total content of the first silane coupling agent contained in the resin composition and the first silane coupling agent contained in the silica particles surface-treated with the first silane coupling agent is 0.2 to 5 parts by mass with respect to 100 parts by mass in total of the silica particles and the silica particles surface-treated with the first silane coupling agent, and a contact surface of the metal layer in contact with the resin layer is surface-treated with a second silane coupling agent having an amino group in a molecule.

9. A wiring board comprising an insulating layer and a wiring present in contact with at least one surface of the insulating layer, wherein
the insulating layer includes a cured product of a resin composition containing a modified polyphenylene ether compound terminally modified with a substituent having a carbon-carbon unsaturated double bond; a crosslinkable curing agent having a carbon-carbon unsaturated double bond in a molecule; a first silane coupling agent having a carbon-carbon unsaturated double bond in a molecule; and at least one of silica particles and silica particles surface-treated with the first silane coupling agent, a total content of the silica particles and the silica particles surface-treated with the first silane coupling agent is 40 to 250 parts by mass with respect to 100 parts by mass in total of the modified polyphenylene ether Compound and the crosslinkable curing agent, a total content of the first silane coupling agent contained in the resin composition and the first silane coupling agent contained in the silica particles surface-treated with the first silane coupling agent is 0.2 to 5 parts by mass with respect to 100 parts by mass in total of the silica particles and the silica particles surface-treated with the first silane coupling agent, and a contact surface of the wiring in contact with the insulating layer is surface-treated with a second silane coupling agent having an amino group in a molecule.

* * * * *